United States Patent
Peng et al.

(10) Patent No.: US 8,902,172 B2
(45) Date of Patent: Dec. 2, 2014

(54) PREVENTING UNINTENTIONAL ACTIVATION OF A TOUCH-SENSOR BUTTON CAUSED BY A PRESENCE OF CONDUCTIVE LIQUID ON THE TOUCH-SENSOR BUTTON

(75) Inventors: Tao Peng, Starkville, MS (US); Guanghai Li, Shanghai (CN)

(73) Assignee: Cypress Semiconductor Corporation, San Jose, CA (US)

( * ) Notice: Subject to any disclaimer, the term of this patent is extended or adjusted under 35 U.S.C. 154(b) by 879 days.

(21) Appl. No.: 11/636,060

(22) Filed: Dec. 7, 2006

(65) Prior Publication Data

US 2008/0136792 A1   Jun. 12, 2008

(51) Int. Cl.
*G06F 3/041* (2006.01)
*G06F 3/044* (2006.01)

(52) U.S. Cl.
CPC .............. *G06F 3/044* (2013.01); *G06F 3/0416* (2013.01); *H03K 2217/960705* (2013.01); *H03K 2217/960715* (2013.01); *H03K 2217/960765* (2013.01); *H03K 2217/96077* (2013.01)
USPC ........................................................ 345/173

(58) Field of Classification Search
USPC ........................................................ 345/173
See application file for complete search history.

(56) References Cited

U.S. PATENT DOCUMENTS

| | | | |
|---|---|---|---|
| 4,293,734 A | 10/1981 | Pepper, Jr. | |
| 4,617,554 A * | 10/1986 | Krause et al. | 341/26 |
| 4,736,191 A | 4/1988 | Matzke et al. | |
| 4,742,331 A | 5/1988 | Barrow et al. | |
| 4,758,830 A * | 7/1988 | Levien et al. | 345/174 |
| 4,772,983 A | 9/1988 | Kerber et al. | |
| 4,879,505 A | 11/1989 | Barrow et al. | |
| 4,920,399 A | 4/1990 | Hall | |
| 4,940,980 A | 7/1990 | Tice | |
| 5,225,959 A * | 7/1993 | Stearns | 361/283.1 |
| 5,281,862 A | 1/1994 | Ma | |
| 5,294,889 A | 3/1994 | Heep et al. | |
| 5,305,017 A | 4/1994 | Gerpheide | |
| 5,543,590 A | 8/1996 | Gillespie et al. | |
| 5,572,205 A | 11/1996 | Caldwell et al. | |
| 5,672,959 A | 9/1997 | Der | |
| 5,682,788 A * | 11/1997 | Netzer | 73/73 |
| 5,684,487 A | 11/1997 | Timko | |
| 5,730,165 A | 3/1998 | Philipp | |
| 5,763,924 A | 6/1998 | Lum et al. | |
| 6,188,391 B1 | 2/2001 | Seely et al. | |
| 6,239,389 B1 | 5/2001 | Allen et al. | |
| 6,271,719 B1 | 8/2001 | Sevastopoulos | |
| 6,271,720 B1 | 8/2001 | Sevastopoulos | |
| 6,288,707 B1 | 9/2001 | Philipp | |

(Continued)

OTHER PUBLICATIONS

Ryan Seguine, et al., "Layout Guidelines for PSoC™ CapSense™", Cypress Application Note AN2292, Revision B, Oct. 31, 2005, pp. 1-15.

(Continued)

*Primary Examiner* — William Boddie
*Assistant Examiner* — Andrew Schnirel

(57) ABSTRACT

An apparatus and method for preventing unintentional activation of the one or more touch-sensor buttons caused by a presence of conductive liquid on the touch panel. The apparatus may include a processing device to prevent unintentional activations of one or more touch-sensor buttons caused by a presence of conductive liquid on the one or more touch-sensor buttons.

13 Claims, 13 Drawing Sheets

(56) References Cited

U.S. PATENT DOCUMENTS

| | | |
|---|---|---|
| 6,323,846 B1 | 11/2001 | Westerman et al. |
| 6,342,817 B1 | 1/2002 | Crofts et al. |
| 6,344,773 B1 | 2/2002 | Sevastopoulos et al. |
| 6,380,931 B1 | 4/2002 | Gillespie et al. |
| 6,441,682 B1 | 8/2002 | Vinn et al. |
| 6,445,257 B1 | 9/2002 | Cox et al. |
| 6,459,321 B1 | 10/2002 | Belch |
| 6,466,036 B1 | 10/2002 | Philipp |
| 6,473,069 B1 | 10/2002 | Gerpheide |
| 6,522,083 B1 | 2/2003 | Roach |
| 6,522,187 B1 | 2/2003 | Sousa |
| 6,535,200 B2 | 3/2003 | Philipp |
| 6,570,557 B1 | 5/2003 | Westerman et al. |
| 6,614,313 B2 | 9/2003 | Crofts et al. |
| 6,704,005 B2 | 3/2004 | Kato et al. |
| 6,879,215 B1 | 4/2005 | Roach |
| 6,888,536 B2 | 5/2005 | Westerman et al. |
| 6,914,547 B1 | 7/2005 | Swaroop et al. |
| 6,933,873 B1 | 8/2005 | Horsley et al. |
| 6,958,594 B2 | 10/2005 | Redl et al. |
| 6,970,126 B1 | 11/2005 | O'Dowd et al. |
| 6,993,607 B2 | 1/2006 | Philipp |
| 7,032,051 B2 | 4/2006 | Reay et al. |
| 7,253,643 B1 | 8/2007 | Seguine |
| 7,288,946 B2 | 10/2007 | Hargreaves et al. |
| 7,301,350 B2 | 11/2007 | Hargreaves et al. |
| 2002/0063688 A1* | 5/2002 | Shaw et al. ............ 345/163 |
| 2004/0008129 A1* | 1/2004 | Philipp ................... 341/22 |
| 2004/0252109 A1 | 12/2004 | Trent, Jr. et al. |
| 2005/0246459 A1* | 11/2005 | Philipp ................... 710/67 |
| 2006/0066582 A1 | 3/2006 | Lyon et al. |
| 2006/0097991 A1 | 5/2006 | Hotelling et al. |
| 2006/0192690 A1* | 8/2006 | Philipp ................... 341/33 |

OTHER PUBLICATIONS

Dennis Seguine, "Capacitive Switch Scan", Cypress Application Note AN2233a, Revision B, Apr. 14, 2005, pp. 1-6.

Dave Van Ess, "Understanding Switched Capacitor Analog Blocks", Cypress Application Note AN2041, Revision B, Mar. 30, 2004, pp. 1-16.

Mark Lee, "CapSense Best Practices", Cypress Application Note AN2394, Rev.**, Oct. 19, 2006, pp. 1-10.

CSD User Module Data Sheet, CSD v1.0, CY8C21x34 Data Sheet, Oct. 6, 2006, pp. 1-36.

CSD User Module Data Sheet, CSD v1.0, Oct. 23, 2006, pp. 1-58.

CSR User Module Data Sheet, CSD v1.0, CY8C21x34 Data Sheet, Oct. 6, 2006, pp. 1-36.

Dennis Seguine, "Capacitive Switch Scan", AN2233a, Application Note, CY8C21x34, Apr. 7, 2005, 6 pages.

Sangil Park, Ph.D., "Motorola Digital Signal Processors, Principles of Sigma-Delta Modulation for Analog-to-Digital Converters", APR8/D Rev. 1. downloaded from: http://digitalsignallabs.com/SigmaDelta.pdf , Mar. 1997.

Sigma-Delta ADCs and DACs, An-283 Application Note, Analog Devices, 16 pages, 1993. downloaded from http://www.analog.com/UploadedFiles/Application_Notes/292524291525717245054923680458171AN283.pdf.

Vladislav Golub, Ph.D., Sigma-delta ADCs, publication date Jun. 17, 2003, 10 pages.

Victor Kremin and Ruslan Bachunskiy, Capacitance Sensing—Waterproof Capacitance Sensing, Cypress Application Note AN2398, Revision *A, Dec. 8, 2006, pp. 1-11.

* cited by examiner

PREVENTING UNINTENTIONAL ACTIVATION OF A TOUCH-SENSOR BUTTON CAUSED BY A PRESENCE OF CONDUCTIVE LIQUID ON THE TOUCH-SENSOR BUTTON

TECHNICAL FIELD

This invention relates to the field of user interface devices and, in particular, to touch-sensor devices.

BACKGROUND

Many electronic devices include a user interface device for allowing user interaction and user input. One user interface device is a button or a key. Conventional buttons include mechanical components to actuate a switch to indicate a button press or button activation. Mechanical buttons also provide a tactile feedback to the user to indicate the button has been pressed. More recently, touch-sensor buttons are being used in some applications to replace mechanical buttons. One type of touch-sensor button operates by way of capacitance sensing, utilizing capacitance sensor elements. The capacitance detected by a capacitance sensor changes as a function of the proximity of a conductive object on the sensor element. The conductive object can be, for example, a stylus or a user's finger. In a touch-sensor button, a change in capacitance detected by each sensor due to the proximity of a conductive object can be measured by a variety of methods. Regardless of the method, usually an electrical signal representative of the capacitance detected by each capacitance sensor is processed by a processing device, which in turn produces electrical or optical signals representative of the button or sensor activation of the touch-sensor button.

FIG. 1A illustrates a conventional sensing device having three touch-sensor buttons. Conventional sensing device 120 includes button 121, button 122, and button 123. These buttons may be capacitive touch-sensor buttons. These three buttons may be used for user input using a conductive object, such as a finger.

In general, capacitance touch-sensors are intended to replace mechanical buttons, knobs, and other similar mechanical user interface controls. However, one disadvantage of capacitance touch-sensors over mechanical buttons is that zero force may be required to activate the sensors, resulting in higher possibility of unintentional activations of the sensors. Using capacitance touch-sensor buttons, especially in household devices, may be unintentionally activated by a presence of water or other conductive liquids, such as grease, wastewater, sludge, fruit juices, yoghurt, milk, alcohol, acids, caustics, water-based emulsions, pulp and paper slurries or the like, on a touch panel of the touch-sensor buttons. Capacitance touch-sensor buttons are configured to detect the capacitance variation introduced by a user's finger (or other conductive objects). However, a water drop on the button may act as a bridging conductor that may unintentionally activate the touch-sensor button. The unintentional activation of touch-sensor button presents a serious safety issue for some household appliance, especially ovens, stoves, microwaves, blenders, heaters, or the like.

In one conventional design, a touch-sensor button, as illustrated in FIG. 1B, includes a capacitive touch-sensor button 130. Capacitive touch-sensor button includes two or more conductors, such as conductors 135 (e.g., grounded conductors) and sensor element 136. When a conductive object, such as finger 133, is placed in proximity to the sensor element 136, there is a capacitance, Cf, between the sensor element 136 and the conductive object with respect to a common ground 137. In a touch-sensor button design, typically one conductor, sensor element 136, is sensed and the sensor element 136 is surrounded by a fixed ground. The fixed ground may be one or more conductors 135 that are connected to system ground 138. There is also parasitic capacitance Cp between the conductors 135 and sensor element 136. The capacitance between the electrodes when no conductive object is present is the base capacitance Cp that may be stored as a baseline value. There is also a total capacitance (Cp+Cf) on the sensor element 136 when the conductive object (e.g. finger 133) is present on or in close proximity to the touch-sensor button 130. The baseline capacitance value Cp may be subtracted from the total capacitance when the conductive object is present to determine the change in capacitance (e.g., capacitance variation Cf) when the conductive object is present and when the conductive object is not present on the sensor element 136. Effectively, the capacitance variation Cf can be measured to determine whether a conductive object is present or not (e.g., sensor activation) on the touch-sensor button 130. The capacitance on the sensor element 136 may be measured using conventional capacitance sensing techniques, such as using a relaxation oscillator circuit or a charge transfer circuit.

In this conventional design, the sensor element 136 is surrounded by a fixed ground of conductors 135, which are connected to system ground 138. The conductors 135 are disposed in the same plane as the sensor element 136. The conductors 135 are disposed in the same plan as the sensor element 136 to achieve larger capacitance variations (Cf) on the sensor element 136 when the finger is touching or in close proximity to the touch-sensor button 130, as compared to a touch-sensor button that is not surrounded by a grounded conductor. Surrounding the sensor element 136 with grounded conductors may increase the possibility that the water 134 (e.g., water drop or film of water) on the overlay of dielectric material 134 of the touch-sensor button acts as a bridging conductor. The capacitance introduced by the bridging conductor between the conductors 135 and sensor element 136 and the water 134 may be sufficient to unintentionally activate the touch-sensor button 130. In other words, the capacitance introduced by the bridging conductor is in the same range as the capacitance Cf as measured to detect the presence of a conductive object, for example, finger 133. If the capacitance introduced by the bridging conductor is greater than a presence threshold, button activation occurs unintentionally.

As previously described, the unintentional activation of touch-sensor button presents a serious safety issue. Many household appliances, as well as other devices, are commonly exposed to such elements as water or humidity, which may unintentionally activate the touch-sensor button of the appliance. Similarly, in many industrial appliances, the touch-sensor buttons may be exposed to other conductive liquids, which may unintentionally activate the touch-sensor button of the appliance. Unintentionally activating the touch-sensor button on some household appliances, especially ovens, stoves, microwaves, blenders, or heaters, may present serious dangers to the appliance itself, the consumer, and/or the consumer's property. Serious dangers may also be presented by unintentional activation of touch-sensor buttons on some industrial appliances.

BRIEF DESCRIPTION OF THE DRAWINGS

The present invention is illustrated by way of example, and not by way of limitation, in the figures of the accompanying drawings.

DETAILED DESCRIPTION

Described herein is apparatus and method for preventing unintentional activation of the one or more touch-sensor buttons caused by a presence of conductive liquid on the touch panel. The following description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the spirit and scope of the present invention.

In one embodiment, the method includes detecting a presence of conductive liquid on a touch panel that includes one or more touch-sensor buttons, and preventing unintentional activation of the one or more touch-sensor buttons when the presence of conductive liquid is detected on the touch panel. The conductive liquid may be water, grease, wastewater, sludge, fruit juices, yoghurt, milk, alcohol, acids, caustics, water-based emulsions, pulp and paper slurries or other liquids that may act like a bridging conductor on the one or more touch-sensor buttons. In one embodiment, the apparatus includes a processing device to prevent unintentional activations of one or more touch-sensor buttons caused by a presence of conductive liquid on the one or more touch-sensor buttons.

Figure 1A:
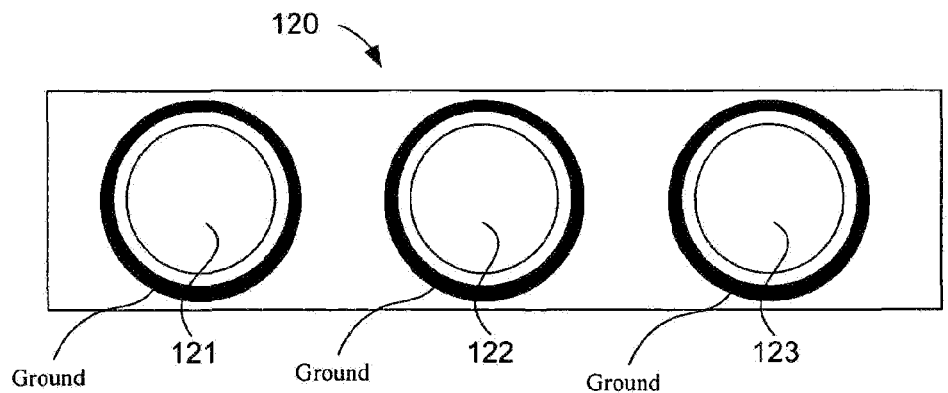
FIG. 1A illustrates a conventional sensing device having three touch-sensor buttons.
Figure 1B:
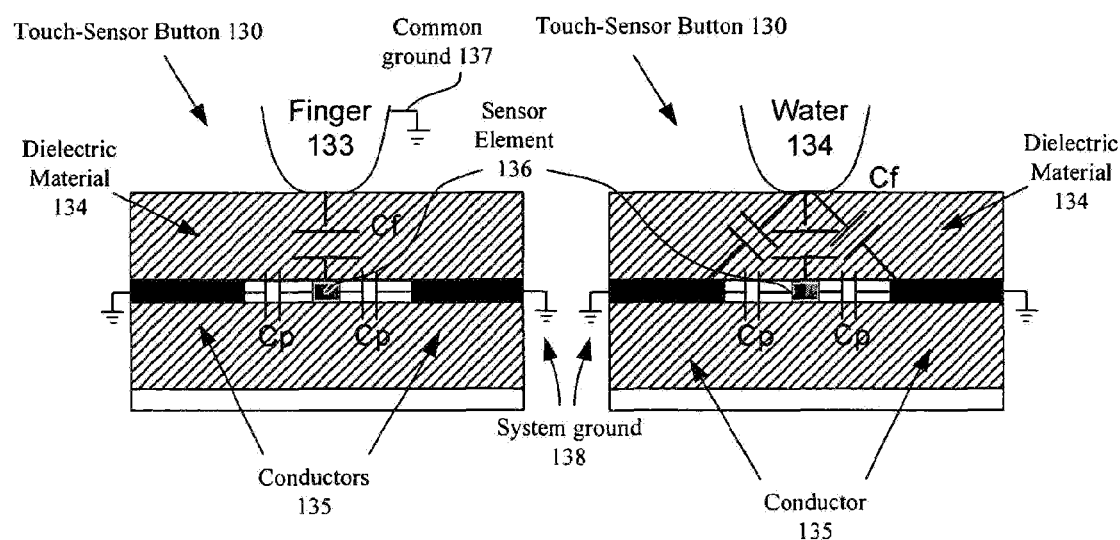
FIG. 1B illustrates a conventional touch-sensor button including a sensor element surrounded by grounded conductors in the same plane.
Figure 2:
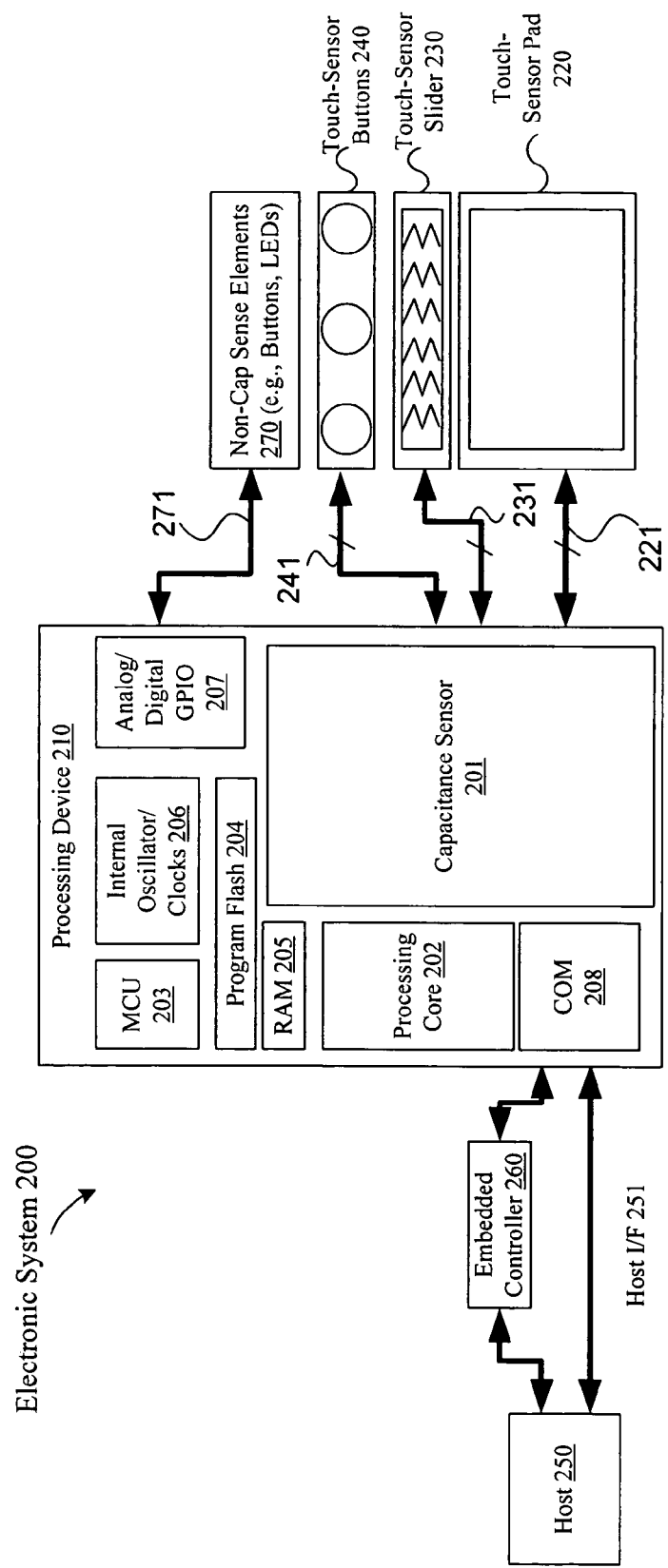
FIG. 2 illustrates a block diagram of one embodiment of an electronic system having a processing device for detecting a presence of a conductive object.

FIG. 2 illustrates a block diagram of one embodiment of an electronic system having a processing device for detecting a presence of a conductive object. Electronic system 200 includes processing device 210, touch-sensor pad 220, touch-sensor slider 230, touch-sensor buttons 240, host processor 250, embedded controller 260, and non-capacitance sensor elements 270. The processing device 210 may include analog and/or digital general purpose input/output ("GPIO") ports 207. GPIO ports 207 may be programmable. GPIO ports 207 may be coupled to a Programmable Interconnect and Logic ("PIL"), which acts as an interconnect between GPIO ports 207 and a digital block array of the processing device 210 (not illustrated). The digital block array may be configured to implement a variety of digital logic circuits (e.g., DAC, digital filters, digital control systems, etc.) using, in one embodiment, configurable user modules ("UMs"). The digital block array may be coupled to a system bus (not illustrated). Processing device 210 may also include memory, such as random access memory (RAM) 205 and program flash 204. RAM 205 may be static RAM (SRAM) or the like, and program flash 204 may be a non-volatile storage, or the like, which may be used to store firmware (e.g., control algorithms executable by processing core 202 to implement operations described herein). Processing device 210 may also include a memory controller unit (MCU) 203 coupled to memory and the processing core 202.

The processing device 210 may also include an analog block array (not illustrated). The analog block array is also coupled to the system bus. Analog block array also may be configured to implement a variety of analog circuits (e.g., ADC, analog filters, etc.) using, in one embodiment, configurable UMs. The analog block array may also be coupled to the GPIO 207.

As illustrated, capacitance sensor 201 may be integrated into processing device 210. Capacitance sensor 201 may include analog I/O for coupling to an external component, such as touch-sensor pad 220, touch-sensor slider 230, touch-sensor buttons 240, and/or other devices. Capacitance sensor 201 and processing device 202 are described in more detail below.

It should be noted that the embodiments described herein are not limited to touch-sensor buttons (e.g., capacitance sensing button), but can be used in other capacitive sensing implementations, for example, the sensing device may be a touch screen, a touch-sensor slider 230, or a touch-sensor pad 220. It should also be noted that the embodiments described herein may be implemented in other sensing technologies than capacitive sensing, such as resistive, optical imaging, surface wave, infrared, dispersive signal, and strain gauge technologies. Similarly, the operations described herein are not limited to notebook pointer operations, but can include other operations, such as lighting control (dimmer), volume control, graphic equalizer control, speed control, or other control operations requiring gradual or discrete adjustments. It should also be noted that these embodiments of capacitive sensing implementations may be used in conjunction with non-capacitive sensing elements, including but not limited to pick buttons, sliders (ex. display brightness and contrast), scroll-wheels, multi-media control (ex. volume, track advance, etc) handwriting recognition and numeric keypad operation.

The electronic system 200 includes a touch-sensor pad 220 coupled to the processing device 210 via bus 221. Touch-sensor pad 220 may include a two-dimension sensor array. The two-dimension sensor array includes multiple sensor elements, organized as rows and columns. The electronic system 200 includes a touch-sensor slider 230 coupled to the processing device 210 via bus 231. Touch-sensor slider 230 may include a single-dimension sensor array. The single-dimension sensor array includes multiple sensor elements, organized as rows, or alternatively, as columns. The electronic system 200 includes touch-sensor buttons 240 coupled to the processing device 210 via bus 241. Touch-sensor button 240 may include a single-dimension or multi-dimension sensor array. The single- or multi-dimension sensor array includes multiple sensor elements. For a touch-sensor button, the sensor elements may be coupled together to detect a presence of a conductive object over the entire surface of the touch panel. Alternatively, the touch-sensor button 240 has a single sensor element to detect the presence of the conductive object. In one embodiment, the touch-sensor button 240 may be a capacitance sensor element. Capacitance sensor elements may be used as non-contact sensor element. These sensor elements, when protected by an insulating layer, offer resistance to severe environments.

The electronic system 200 may include any combination of one or more of the touch-sensor pad 220, touch-sensor slider 230, and/or touch-sensor button 240. In another embodiment, the electronic system 200 may also include non-capacitance sensor elements 270 coupled to the processing device 210 via bus 271. The non-capacitance sensor elements 270 may include mechanical buttons, light emitting diodes (LEDs), and other user interface devices, such as a mouse, a keyboard, or other functional keys that do not require capacitance sensing. In one embodiment, buses 271, 241, 231, and 221 may be a single bus. Alternatively, these buses may be configured into any combination of one or more separate buses.

The processing device may also provide value-added functionality such as keyboard control integration, LEDs, battery charger and general purpose I/O, as illustrated as non-capacitance sensor elements 270. Non-capacitance sensor elements 270 are coupled to the GPIO 207.

Processing device 210 may include internal oscillator/clocks 206 and communication block 208. The oscillator/clocks block 206 provides clock signals to one or more of the components of processing device 210. Communication block 208 may be used to communicate with an external component, such as a host processor 250, via host interface (I/F) line 251. Alternatively, processing block 210 may also be coupled to embedded controller 260 to communicate with the external components, such as host 250. Interfacing to the host 250 can be through various methods. In one exemplary embodiment, interfacing with the host 250 may be done using a standard PS/2 interface to connect to an embedded controller 260, which in turn sends data to the host 250 via a low pin count (LPC) interface. In some instances, it may be beneficial for the processing device 210 to do both touch-sensor pad and keyboard control operations, thereby freeing up the embedded controller 260 for other housekeeping functions. In another exemplary embodiment, interfacing may be done using a universal serial bus (USB) interface directly coupled to the host 250 via host interface line 251. Alternatively, the processing device 210 may communicate to external components, such as the host 250 using industry standard interfaces, such as USB, PS/2, inter-integrated circuit (I2C) bus, or system packet interfaces (SPI). The host 250 and/or embedded controller 260 may be coupled to the processing device 210 with a ribbon or flex cable from an assembly, which houses the sensing device and processing device.

In one embodiment, the processing device 210 is configured to communicate with the embedded controller 260 or the host 250 to send and/or receive data. The data may be a command or alternatively a signal. In an exemplary embodiment, the electronic system 200 may operate in both standard-mouse compatible and enhanced modes. The standard-mouse compatible mode utilizes the HID class drivers already built into the Operating System (OS) software of host 250. These drivers enable the processing device 210 and sensing device to operate as a standard pointer control user interface device, such as a two-button PS/2 mouse. The enhanced mode may enable additional features such as scrolling or disabling the sensing device, such as when a mouse is plugged into the notebook. Alternatively, the processing device 210 may be configured to communicate with the embedded controller 260 or the host 250, using non-OS drivers, such as dedicated touch-sensor pad drivers, or other drivers known by those of ordinary skill in the art.

In one embodiment, the processing device 210 may operate to communicate data (e.g., commands or signals) using hardware, software, and/or firmware, and the data may be communicated directly to the processing device of the host 250, such as a host processor, or alternatively, may be communicated to the host 250 via drivers of the host 250, such as OS drivers, or other non-OS drivers. It should also be noted that the host 250 may directly communicate with the processing device 210 via host interface 251.

In one embodiment, the data sent to the host 250 from the processing device 210 includes click, double-click, movement of the pointer, scroll-up, scroll-down, scroll-left, scroll-right, step Back, and step Forward. In another embodiment, the data sent to the host 250 include the position or location of the conductive object on the sensing device. Alternatively, other user interface device commands may be communicated to the host 250 from the processing device 210. These commands may be based on gestures occurring on the sensing device that are recognized by the processing device, such as tap, push, hop, drag, and zigzag gestures. Alternatively, other commands may be recognized. Similarly, signals may be sent that indicate the recognition of these operations.

In particular, a tap gesture, for example, may be when the finger (e.g., conductive object) is on the sensing device for less than a threshold time. If the time the finger is placed on the touchpad is greater than the threshold time it may be considered to be a movement of the pointer, in the x- or y-axes. Scroll-up, scroll-down, scroll-left, and scroll-right, step back, and step-forward may be detected when the absolute position of the conductive object is within a pre-defined area, and movement of the conductive object is detected. In another embodiment, the touch-sensor button may be activated when a capacitance of a sensor element of the touch-sensor button exceeds a presence threshold. Alternatively, the touch-sensor button may be activated when a tap gesture is recognized on the touch-sensor button.

Processing device 210 may reside on a common carrier substrate such as, for example, an integrated circuit (IC) die substrate, a multi-chip module substrate, or the like. Alternatively, the components of processing device 210 may be one or more separate integrated circuits and/or discrete components. In one exemplary embodiment, processing device 210 may be a Programmable System on a Chip (PSoC™) processing device, manufactured by Cypress Semiconductor Corporation, San Jose, Calif. Alternatively, processing device 210 may be one or more other processing devices known by those of ordinary skill in the art, such as a microprocessor or central processing unit, a controller, special-purpose processor, digital signal processor (DSP), an application specific integrated circuit (ASIC), a field programmable gate array (FPGA), or the like. In an alternative embodiment, for example, the processing device may be a network processor having multiple processors including a core unit and multiple microengines. Additionally, the processing device may include any combination of general-purpose processing device(s) and special-purpose processing device(s).

It should also be noted that the embodiments described herein are not limited to having a configuration of a processing device coupled to a host, but may include a system that measures the capacitance on the sensing device and sends the raw data to a host computer where it is analyzed by an application. In effect the processing that is done by processing device 210 may also be done in the host.

In one embodiment, the method and apparatus described herein may be implemented in a fully self-contained sensing device (including the processing device), which outputs fully processed x/y movement and gesture data signals or data commands to a host. In another embodiment, the method and apparatus may be implemented in a sensing device, which outputs positional data, gesture data, and/or finger presence data to a host, and where the host processes the received data to detect gestures. In another embodiment, the method and apparatus may be implemented in a sensing device, which outputs raw capacitance data to a host, where the host processes the capacitance data to compensate for quiescent and stray capacitance, and calculates positional information, detects the presence of the conductive object and/or detects gestures by processing the capacitance data. Alternatively, the method and apparatus may be implemented in a sensing device, which outputs pre-processed capacitance data to a host, where the sensing device processes the capacitance data to compensate for quiescent and stray capacitance, and the host calculates positional information, detects presence of the conductive object, and/or detects gestures from the pre-processed capacitance data.

Capacitance sensor 201 may be integrated into the processing device 210, or alternatively, in a separate IC. Alternatively, descriptions of capacitance sensor 201 may be generated and compiled for incorporation into other integrated circuits. For example, behavioral level code describing capacitance sensor 201, or portions thereof, may be generated using a hardware descriptive language, such as VHDL or Verilog, and stored to a machine-accessible medium (e.g., Flash ROM, CD-ROM, hard disk, floppy disk, etc.). Furthermore, the behavioral level code can be compiled into register transfer level ("RTL") code, a netlist, or even a circuit layout and stored to a machine-accessible medium. The behavioral level code, the RTL code, the netlist, and the circuit layout all represent various levels of abstraction to describe capacitance sensor 201.

It should be noted that the components of electronic system 200 may include all the components described above. Alternatively, electronic system 200 may include only some of the components described above, or include additional components not listed herein.

In one embodiment, electronic system 200 may be used in a notebook computer. Alternatively, the electronic device may be used in other applications, such as a mobile handset, a personal data assistant (PDA), a keyboard, a television, a remote control, a monitor, a handheld multi-media device, a handheld video player, a handheld gaming device, or a control panel.

In one embodiment, capacitance sensor 201 may be a capacitive switch relaxation oscillator (CSR). The CSR may be coupled to an array of sensor elements using a current-programmable relaxation oscillator, an analog multiplexer, digital counting functions, and high-level software routines to compensate for environmental and physical sensor element variations. The sensor array may include combinations of independent sensor elements, sliding sensor elements (e.g., touch-sensor slider), and touch-sensor sensor element pads (e.g., touch pad) implemented as a pair of orthogonal sliding sensor elements. The CSR may include physical, electrical, and software components. The physical component may include the physical sensor element itself, typically a pattern constructed on a printed circuit board (PCB) with an insulating cover, a flexible membrane, or a transparent overlay. The electrical component may include an oscillator or other means to convert a charged capacitance into a measured signal. The electrical component may also include a counter or timer to measure the oscillator output. The software component may include detection and compensation software algorithms to convert the count value into a sensor element detection decision (also referred to as switch detection decision). For example, in the case of slider sensor elements or X-Y touch-sensor sensor element pads, a calculation for finding position of the conductive object to greater resolution than the physical pitch of the sensor elements may be used.

It should be noted that there are various known methods for measuring capacitance. Although some embodiments described herein are described using a relaxation oscillator, the present embodiments are not limited to using relaxation oscillators, but may include other methods, such as current versus voltage phase shift measurement, resistor-capacitor charge timing, capacitive bridge divider, charge transfer, sigma-delta modulators, charge-accumulation circuits, or the like.

The current versus voltage phase shift measurement may include driving the capacitance through a fixed-value resistor to yield voltage and current waveforms that are out of phase by a predictable amount. The drive frequency can be adjusted to keep the phase measurement in a readily measured range. The resistor-capacitor charge timing may include charging the capacitor through a fixed resistor and measuring timing on the voltage ramp. Small capacitance values may require very large resistors for reasonable timing. The capacitive bridge divider may include driving the capacitor under test through a fixed reference capacitor. The reference capacitor and the capacitor under test form a voltage divider. The voltage signal is recovered with a synchronous demodulator, which may be done in the processing device 210. The charge transfer may be conceptually similar to an R-C charging circuit. In this method, $C_P$ is the capacitance being sensed. $C_{SUM}$ is the summing capacitor, into which charge is transferred on successive cycles. At the start of the measurement cycle, the voltage on $C_{SUM}$ is reset. The voltage on $C_{SUM}$ increases exponentially (and only slightly) with each clock cycle. The time for this voltage to reach a specific threshold is measured with a counter. Additional details regarding these alternative embodiments have not been included so as to not obscure the present embodiments, and because these alternative embodiments for measuring capacitance are known by those of ordinary skill in the art.

Figure 3A:
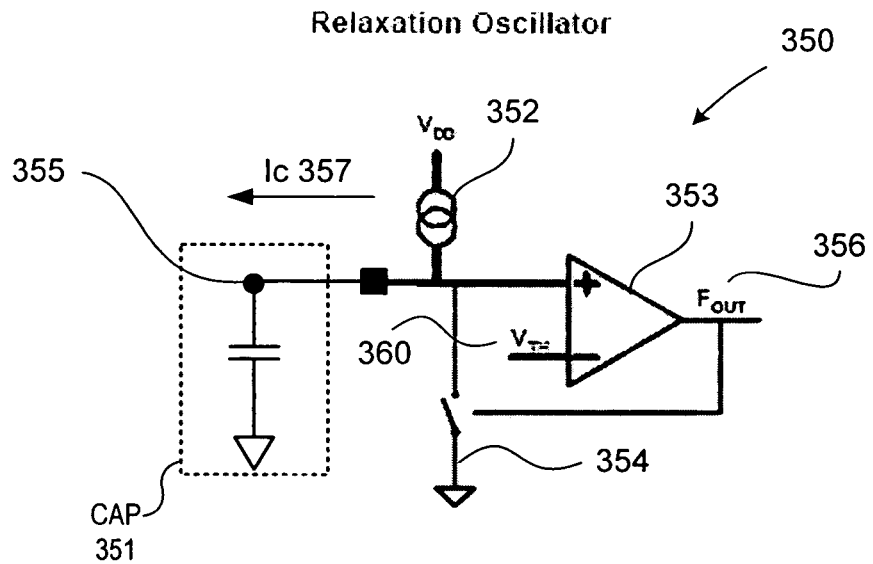
FIG. 3A illustrates one embodiment of a relaxation oscillator for measuring a capacitance on a sensor element.

FIG. 3A illustrates one embodiment of a relaxation oscillator for measuring a capacitance on a sensor element 351. The relaxation oscillator 350 is formed by the capacitance to be measured on sensor element 351 (represented as capacitor 351), a charging current source 352, a comparator 353, and a reset switch 354 (also referred to as a discharge switch). It should be noted that capacitor 351 is representative of the capacitance measured on a sensor element. The sensor element and the one or more surrounding grounded conductors may be metal, or alternatively, the conductors may be conductive ink (e.g., carbon ink) or conductive polymers. The relaxation oscillator is coupled to drive a charging current (Ic) 357 in a single direction onto a device under test ("DUT") capacitor, capacitor 351. As the charging current piles charge onto the capacitor 351, the voltage across the capacitor increases with time as a function of Ic 357 and its capacitance C. Equation (1) describes the relation between current, capacitance, voltage, and time for a charging capacitor.

$$CdV = I_c dt \quad (1)$$

The relaxation oscillator begins by charging the capacitor 351, at a fixed current Ic 357, from a ground potential or zero voltage until the voltage across the capacitor 351 at node 355 reaches a reference voltage or threshold voltage, $V_{TH}$ 360. At the threshold voltage $V_{TH}$ 360, the relaxation oscillator allows the accumulated charge at node 355 to discharge (e.g., the capacitor 351 to "relax" back to the ground potential) and then the process repeats itself. In particular, the output of comparator 353 asserts a clock signal $F_{OUT}$ 356 (e.g., $F_{OUT}$ 356 goes high), which enables the reset switch 354. This discharges the voltage on the capacitor at node 355 to ground and the charge cycle starts again. The relaxation oscillator outputs a relaxation oscillator clock signal ($F_{OUT}$ 356) having a frequency ($f_{RO}$) dependent upon capacitance C of the capacitor 351 and charging current Ic 357.

The comparator trip time of the comparator 353 and reset switch 354 add a fixed delay. The output of the comparator 353 is synchronized with a reference system clock to guarantee that the reset time is long enough to completely discharge capacitor 351. This sets a practical upper limit to the operating frequency. For example, if capacitance C of the capacitor 351 changes, then $f_{RO}$ changes proportionally according to Equation (1). By comparing $f_{RO}$ of $F_{OUT}$ 356 against the frequency ($f_{REF}$) of a known reference system clock signal (REF CLK), the change in capacitance ($\Delta C$) can be measured. Accordingly, equations (2) and (3) below describe that a change in frequency between $F_{OUT}$ 356 and REF CLK is proportional to a change in capacitance of the capacitor 351.

$$\Delta C \propto \Delta f, \text{ where} \quad (2)$$

$$\Delta f = f_{RO} - f_{REF}. \quad (3)$$

In one embodiment, a frequency comparator may be coupled to receive relaxation oscillator clock signal ($F_{OUT}$ 356) and REF CLK, compare their frequencies $f_{RO}$ and $f_{REF}$, respectively, and output a signal indicative of the difference $\Delta f$ between these frequencies. By monitoring $\Delta f$ one can determine whether the capacitance of the capacitor 351 has changed.

In one exemplary embodiment, the relaxation oscillator 350 may be built using a programmable timer to implement the comparator 353 and reset switch 354. Alternatively, the relaxation oscillator 350 may be built using other circuiting. Relaxation oscillators are known by those of ordinary skill in the art, and accordingly, additional details regarding their operation have not been included so as to not obscure the present embodiments. The capacitor charging current for the relaxation oscillator 350 may be generated in a register programmable current output DAC (also known as IDAC). Accordingly, the current source 352 may be a current DAC or IDAC. The IDAC output current may be set by an 8-bit value provided by the processing device 210, such as from the processing core 202. The 8-bit value may be stored in a register or in memory.

In many capacitance sensor element designs, the two "conductors" of the sensing capacitor are actually adjacent sensor elements that are electrically isolated (e.g., PCB pads or traces). Typically, one of these conductors is connected to a system ground. Layouts for touch-sensor slider (e.g., linear slide sensor elements) and touch-sensor pad applications have sensor elements that may be immediately adjacent. In these cases, all of the sensor elements that are not active are connected to a system ground through the GPIO 207 of the processing device 210 dedicated to that pin. The actual capacitance between adjacent conductors is small (Cp), but the capacitance of the active conductor (and its PCB trace back to the processing device 210) to ground, when detecting the presence of the conductive object 303, may be considerably higher (Cp+Cf). The capacitance of two adjacent conductors is given by the following equation:

$$C = \varepsilon_0 \cdot \varepsilon_R \cdot \frac{A}{d} = \varepsilon_R \cdot 8.85 \cdot \frac{A}{d} \text{ pF/m} \quad (4)$$

The dimensions of equation (4) are in meters. This is a very simple model of the capacitance. The reality is that there are fringing effects that substantially increase the sensor element-to-ground (and PCB trace-to-ground) capacitance.

Sensor element sensitivity (i.e., activation distance) may be increased by one or more of the following: 1) increasing board thickness to increase the distance between the active sensor element and any parasitics; 2) minimizing PCB trace routing underneath sensor elements; 3) utilizing a gridded ground with 50% or less fill if use of a ground plane is absolutely necessary; 4) increasing the spacing between sensor element pads and any adjacent ground plane; 5) increasing pad area; 6) decreasing thickness of any insulating overlay; 7) using higher dielectric constant material in the insulating overlay; or 8) verifying that there is no air-gap between the PC pad surface and the touching finger.

There is some variation of sensor element sensitivity as a result of environmental factors. A baseline update routine, which compensates for this variation, may be provided in the high-level APIs.

As described above with respect to the relaxation oscillator 350, when a finger or conductive object is placed on the sensor element, the capacitance increases from Cp to Cp+Cf so the relaxation oscillator output signal 356 ($F_{OUT}$) decreases. The relaxation oscillator output signal 356 ($F_{OUT}$) may be fed to a digital counter for measurement. There are two methods for counting the relaxation oscillator output signal 356: frequency measurement and period measurement. Additional details of the relaxation oscillator and digital counter are known by those of ordinary skill in the art, and accordingly a detailed description regarding them have not been included. It should also be noted, that the embodiments described herein are not limited to using relaxation oscillators, but may include other sensing circuitry for measuring capacitance, such as versus voltage phase shift measurement, resistor-capacitor charge timing, capacitive bridge divider, charge transfer, sigma-delta modulators, charge-accumulation circuits, or the like.

Figure 3B:
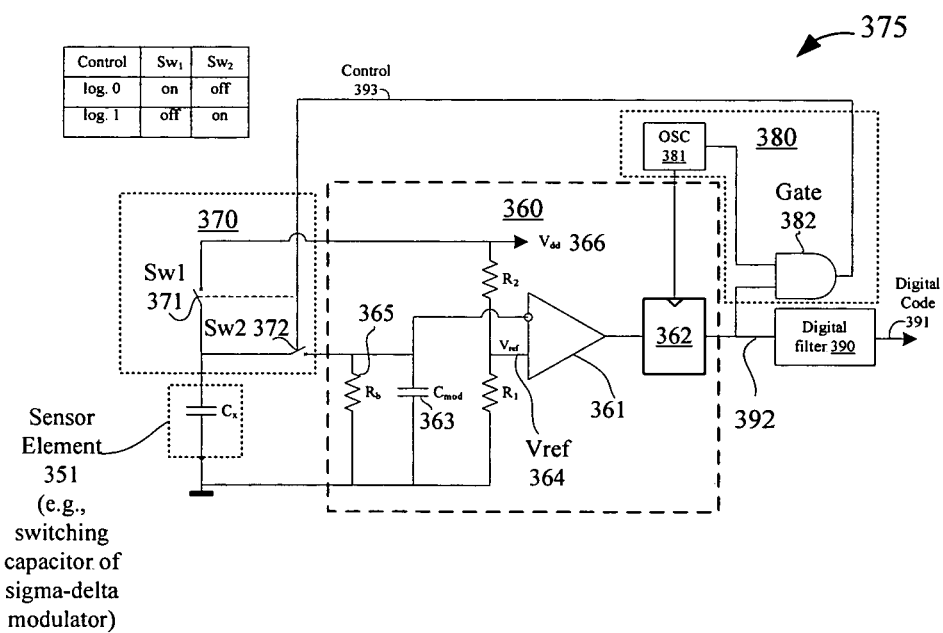
FIG. 3B illustrates a schematic of one embodiment of a circuit including a sigma-delta modulator and a digital filter for measuring capacitance on a sensor element.

FIG. 3B illustrates a schematic of one embodiment of a circuit 375 including a sigma-delta modulator 360 and a digital filter 390 for measuring capacitance on a sensor element 351. Circuit 375 includes a switching circuit 370, switching clock source 380, sigma-delta modulator 360, and digital filter 390 for measuring the capacitance on sensor element 351. Sensor element 351 may be a used for a touch-sensor button, and is represented as a switching capacitor Cx in the modulator feedback loop. Switching circuit 370 includes two switches $Sw_1$ 371 and $Sw_2$ 372. The switches $Sw_1$ 371 and $Sw_2$ 372 operate in two, non-overlapping phases (also known as break-before-make configuration). These switches together with sensing capacitor $C_x$ 351 form the switching capacitor equivalent resistor, which provides the modulator capacitor $C_{mod}$ 363 of sigma-delta modulator 360 charge current (as illustrated in FIG. 3B) or discharge current (not illustrated) during one of the two phases.

The sigma-delta modulator 360 includes the comparator 361, latch 362, modulator capacitor $C_{mod}$ 363, modulator feedback resistor 365, which may also be referred to as bias resistor 365, and voltage source 366. The output of the comparator may be configured to toggle when the voltage on the modulator capacitor 363 crosses a reference voltage 364. The reference voltage 364 may be a pre-programmed value, and may be configured to be programmable. The sigma-delta modulator 360 also includes a latch 362 coupled to the output of the comparator 361 to latch the output of the comparator 361 for a given amount of time, and provide as an output, output 392. The latch may be configured to latch the output of the comparator based on a clock signal from the gate circuit 382 (e.g., oscillator signal from the oscillator 381). In another embodiment, the sigma-delta modulator 360 may include a synchronized latch that operates to latch an output of the comparator for a pre-determined length of time. The output of the comparator may be latched for measuring or sampling the output signal of the comparator 361 by the digital filter 390.

Sigma-delta modulator 360 is configured to keep the voltage on the modulator capacitor 363 close to reference voltage $V_{ref}$ 364 by alternatively connecting the switching capacitor resistor (e.g., switches $Sw_1$ 371 and $Sw_2$ 372 and sensing capacitor $C_x$ 351) to the modulator capacitor 363. The output 392 of the sigma-delta modulator 360 (e.g., output of latch 362) is feedback to the switching clock circuit 380, which controls the timing of the switching operations of switches $Sw_1$ 371 and $Sw_2$ 372 of switching circuit 370. For example, in this embodiment, the switching clock circuit 380 includes an oscillator 381 and gate 382. Alternatively, the switching clock circuit 380 may include a clock source, such as a spread spectrum clock source (e.g., pseudo-random signal (PRS)), a frequency divider, a pulse width modulator (PWM), or the like. The output 392 of the sigma-delta modulator 360 is used with an oscillator signal to gate a control signal 393, which switches the switches $Sw_1$ 371 and $Sw_2$ 372 in a non-overlapping manner (e.g., two, non-overlapping phases). The output 392 of the sigma-delta modulator 360 is also output to digital filter 430, which filters and/or converts the output into the digital code 391.

In one embodiment of the method of operation, at power on, the modulator capacitor 363 has zero voltage and switching capacitor resistor (formed by sensing capacitor Cx 351, and switches $Sw_1$ 371 and $Sw_2$ 372) is connected between Vdd line 366 and modulator capacitor 363. This connection allows the voltage on the modulator capacitor 363 to rise. When this voltage reaches the comparator reference voltage, $V_{ref}$ 364, the comparator 361 toggles and gates the control signal 393 of the switches $Sw_1$ 371 and $Sw_2$ 372, stopping the charge current. Because the current via bias resistors $R_b$ 365 continues to flow, the voltage on modulator capacitor 363 starts dropping. When it drops below the reference voltage 364, the output of the comparator 361 switches again, enabling the modulator 363 to start charging. The latch 362 and the comparator 361 set sample frequency of the sigma-delta modulator 360.

The digital filter 390 is coupled to receive the output 392 of the sigma-delta modulator 360. The output 392 of the sigma-delta modulator 360 may be a single bit bit-stream, which can be filtered and/or converted to the numerical values using a digital filter 390. In one embodiment, the digital filter 390 is a counter. In another embodiment, the standard Sinc digital filter can be used. In another embodiment, the digital filter is a decimator. Alternatively, other digital filters may be used for filtering and/or converting the output 392 of the sigma-delta modulator 360 to provide the digital code 391. It should also be noted that the output 392 may be output to the decision logic 402 or other components of the processing device 210, or to the decision logic 451 or other components of the host 250 to process the bitstream output of the sigma-delta modulator 360.

Described below are the mathematical equations that represent the operations of FIG. 3B. During a normal operation mode, the sigma-delta modulator 360 keeps these currents equal in the average by keeping the voltage on the modulator 363 equal to, or close to, the reference voltage $V_{ref}$ 364. The current of the bias resistor $R_b$ 365 is:

$$I_{Rb} = \frac{V_{cmod}}{R_b} \quad (5)$$

The sensing capacitor $C_x$ 351 in the switched-capacitor mode has equivalent resistance:

$$R_c = \frac{1}{f_s C_x} \quad (6)$$

where $f_s$ is the operation frequency of the switches (e.g., switching circuit 370). If the output 392 of the sigma-delta modulator 360 has a duty cycle of $d_{mod}$, the average current of the switching capacitor 351 can be expressed in the following equation (7):

$$I_c = d_{mod} \frac{V_{dd} - V_{Cmod}}{R_c} \quad (7)$$

In the operation mode, $$I_{Rb} = I_c, V_{Cmod} = V_{ref} \text{ or: } \frac{V_{ref}}{R_b} = d_{mod}\frac{V_{dd} - V_{ref}}{R_c} \qquad (8)$$

or taking into account that the reference voltage 364 is part of supply voltage:

$$V_{ref} = k_d V_{dd}; k_d = \frac{R_1}{R_1 + R_2} \qquad (9)$$

The Equation (5) can be rewritten in the following form:

$$d_{mod} = \frac{R_c}{R_b}\frac{k_d}{1-k_d} = \frac{1}{f_s R_b}\frac{k_d}{1-k_d}\frac{1}{C_x} \qquad (10)$$

The Equation (10) determines the minimum sensing capacitance value, which can be measured with the proposed method at given parameters set:

$$d_{mod} \le 1, \text{ or: } C_{xmin} = \frac{1}{f_s R_b}\frac{k_d}{1-k_d} \qquad (11)$$

The resolution of this method may be determined by the sigma-delta modulator duty cycle measurement resolution, which is represented in the following equations:

$$\Delta d_{mod} = \beta \frac{\Delta C_x}{C_x^2}; \qquad (12)$$

$$\beta = \frac{1}{f_s R_b}\frac{k_d}{1-k_d}$$

or after rewriting relatively $\Delta C_x$, we obtain:

$$\Delta C_x = \frac{1}{\beta}\Delta d_{mod} C_x^2 \qquad (13)$$

In one exemplary embodiment, the resistance of the bias resistor 365 is 20K Ohms ($R_b$=20 k), the operation frequency of the switches is 12 MHz ($f_s$=12 MHz), the capacitance on the switching capacitor 351 is 15 picofarads ($C_x$=15 pF), and the ratio between Vdd 366 and the voltage reference 364 is 0.25 ($k_d$=0.25), the duty cycle has a 12-bit resolution and the capacitance resolution is 0.036 pF.

In some embodiments of capacitive sensing applications, it may be important to get fast data measurements. For example, the modulator can operate at sample frequency 10 MHz (period is 0.1 microseconds (us)), for the 12-bit resolution sample, and digital filter as single-type integrator/counter the measurement time is approximately 410 us (e.g., $2^{12}*0.1$ us=410 us). For faster measurement speeds at same resolutions, other types of digital filters may be used, for example, by using the Sinc2 filter, the scanning time at the same resolution may be reduced approximately 4 times. To do this the sensing method should have suitable measurement speed. In one embodiment, a good measurement rate may be accomplished by using a double integrator as the digital filter 390.

Figure 4:
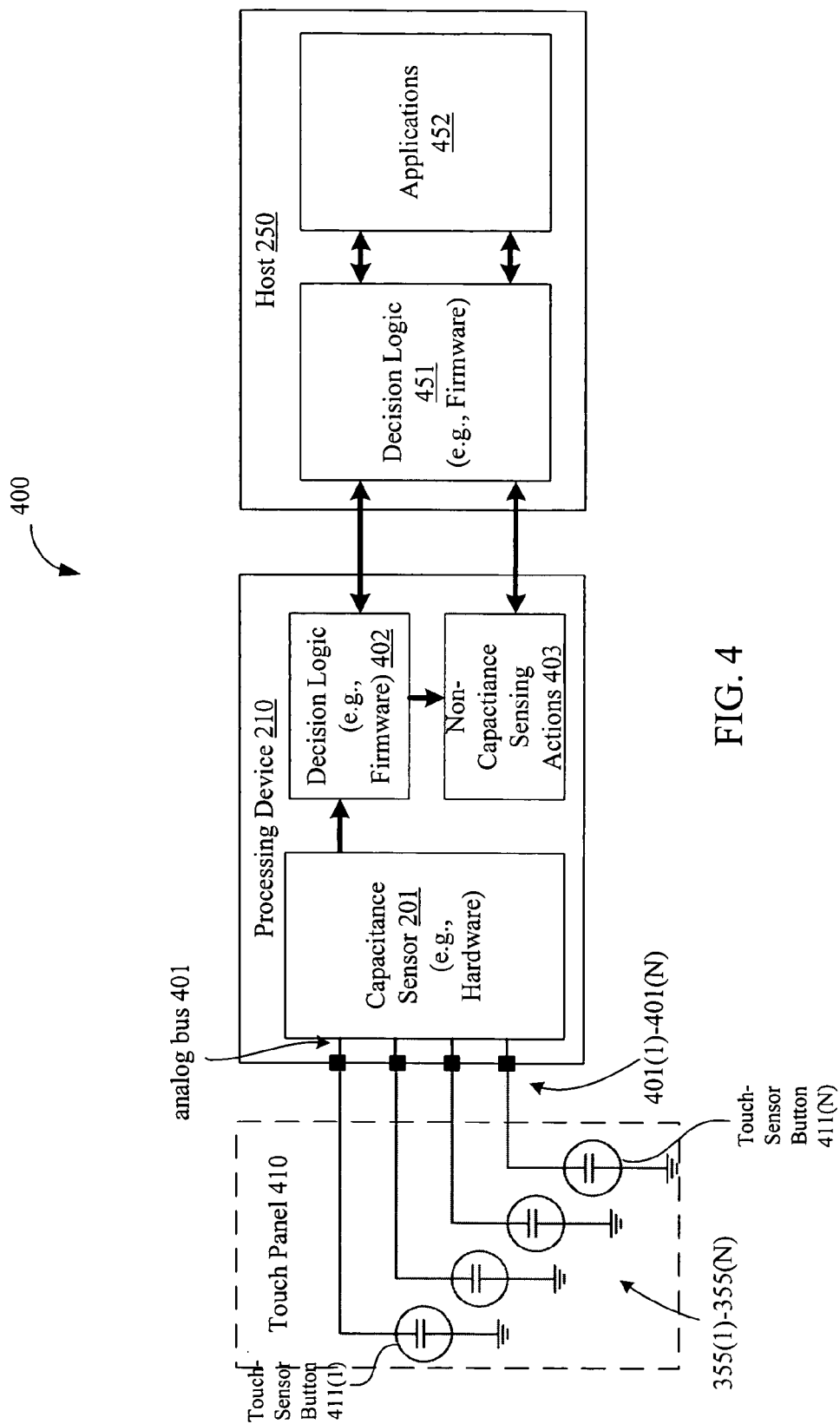
FIG. 4 illustrates a block diagram of one embodiment of an electronic device 400 including a processing device that includes capacitance sensor 201 for measuring the capacitance on a touch panel 410.

FIG. 4 illustrates a block diagram of one embodiment of an electronic device 400 including a processing device that includes capacitance sensor 201 for measuring the capacitance on a touch panel 410. The electronic device 400 of FIG. 4 includes a touch panel 410, processing device 210, and host 250. Touch panel 410 includes sensor elements 355(1)-355 (N), where N is a positive integer value that represents the number of touch-sensor buttons 411(1)-411(N) of the touch panel 410. Each sensor element is represented as a capacitor, as described above with respect to FIG. 3A. The touch panel 410 is coupled to processing device 210 via an analog bus 401 having multiple pins 401(1)-401(N). Although the embodiment of FIG. 4 illustrates multiple sensor elements, alternatively, a single touch-sensor button may be used.

In one embodiment, the capacitance sensor 201 includes a selection circuit (not illustrated). The selection circuit is coupled to the sensor elements 355(1)-355(N) and the sensing circuitry of the capacitance sensor 201. Selection circuit may be used to allow the capacitance sensor to measure capacitance on multiple sensor elements of multiple touch-sensor buttons. The selection circuit may be configured to sequentially select a sensor element to provide the charge current and to measure the capacitance of the selected sensor element. In one exemplary embodiment, the selection circuit is a multiplexer array. Alternatively, selection circuit may be other circuitry inside or outside the capacitance sensor 201 to select the sensor element to be measured. In another embodiment, one capacitance sensor 201 may be used to measure capacitance on all of the sensor elements of the touch panel. Alternatively, multiple capacitance sensors 201 may be used to measure capacitance on the sensor elements of the touch panel. The multiplexer array may also be used to connect the sensor elements that are not being measured to the system ground. This may be done in conjunction with a dedicated pin in the GP10 port 207.

In another embodiment, the capacitance sensor 201 may be configured to simultaneously sense the sensor elements, as opposed to being configured to sequentially sense the sensor elements as described above. Alternatively, other methods for sensing known by those of ordinary skill in the art may be used to scan the sensing device.

In one embodiment, the processing device 210 further includes a decision logic block 402. The operations of decision logic block 402 may be implemented in firmware; alternatively, it may be implemented in hardware or software. The decision logic block 402 may be configured to receive the digital code or counts from the capacitance sensor 201, and to determine the state of the touch panel 410, such as whether a conductive object is detected on the touch panel, whether a touch-sensor button or multiple touch-sensor buttons have been activated (button or sensor activation), or the like.

In another embodiment, instead of performing the operations of the decision logic 402 in the processing device 210, the processing device 201 may send the raw data to the host 250, as described above. Host 250, as illustrated in FIG. 4, may include decision logic 451. The operations of decision logic 451 may also be implemented in firmware, hardware, and/or software. Also, as described above, the host may include high-level APIs in applications 452 that perform routines on the received data, such as compensating for sensitivity differences, other compensation algorithms, baseline update routines, start-up and/or initialization routines, interpolations operations, scaling operations, or the like. The operations described with respect to the decision logic 402 may be implemented in decision logic 451 applications 452, or in other hardware, software, and/or firmware external to the processing device 210.

In another embodiment, the processing device 210 may also include a non-capacitance sensing actions block 403. This block may be used to process and/or receive/transmit data to and from the host 250. For example, additional components may be implemented to operate with the processing device 210 along with the touch panel 410 (e.g., keyboard, keypad, mouse, trackball, LEDs, displays, or the like).

At startup (or boot) the sensor elements (e.g., capacitors 355(1)-(N)) are scanned and the count values for each sensor element with no activation are stored as a baseline array (Cp). The presence of a finger on the sensor element is determined by the difference in counts between a stored value for no sensor element activation and the acquired value with sensor element activation, referred to here as $\Delta n$. The sensitivity of a single sensor element is approximately:

$$\frac{\Delta n}{n} = \frac{Cf}{Cp} \tag{14}$$

The value of $\Delta n$ should be large enough for reasonable resolution and clear indication of sensor element activation. This drives sensor element construction decisions. Cf should be as large a fraction of Cp as possible. Since Cf is determined by finger area and distance from the finger to the sensor element's conductive traces (through the over-lying insulator), the baseline capacitance Cp should be minimized. The baseline capacitance Cp includes the capacitance of the sensor element plus any parasitics, including routing and chip pin capacitance.

In capacitance sensing applications, variations in sensitivity should be minimized. If there are large differences in $\Delta n$, one sensor element may activate at 1.0 cm, while another may not activate until direct contact. This presents a non-ideal user interface device. There are numerous methods for balancing the sensitivity. These may include precisely matching on-board capacitance with PCB trace length modification, adding balance capacitors on each sensor element's PCB trace, and/or adapting a calibration factor to each sensor element to be applied each time the sensor element is measured.

In one embodiment, the PCB design may be adapted to minimize capacitance, including thicker PCBs where possible. In one exemplary embodiment, a 0.062 inch thick PCB is used. Alternatively, other thicknesses may be used, for example, a 0.015 inch thick PCB.

Sliding sensor elements may be used for control requiring gradual or discrete adjustments. Examples include a lighting control (dimmer), volume control, graphic equalizer, and speed control. Slider controls may also be used for scrolling functions in menus of data. These sensor elements may be mechanically adjacent to one another. Activation of one sensor element results in partial activation of physically adjacent sensor elements. The actual position in the sliding sensor element is found by computing the centroid location of the set of sensor elements activated.

In applications for touch-sensor sliders (e.g., sliding sensor elements) and touch-sensor pads it is often necessary to determine finger (or other capacitive object) position to greater resolution than the native pitch of the individual sensor elements. The contact area of a finger on a sliding sensor element is often larger than any single sensor element. In one embodiment, in order to calculate the interpolated position using a centroid, the array is first scanned to verify that a given sensor element location is valid. The requirement is for some number of adjacent sensor element signals to be above a noise threshold. When the strongest signal is found, this signal and those immediately adjacent are used to compute a centroid:

$$\text{Centroid} = \frac{n_{i-1} \cdot (i-1) + n_i i + n_{i+1} \cdot (i+1)}{n_{i-1} + n_i i + n_{i+1}} \tag{15}$$

The calculated value may be fractional. In order to report the centroid to a specific resolution, for example a range of 0 to 100 for 12 sensor elements, the centroid value may be multiplied by a calculated scalar. It may be more efficient to combine the interpolation and scaling operations into a single calculation and report this result directly in the desired scale. This may be handled in the high-level APIs. Alternatively, other methods may be used to interpolate the position of the conductive object.

A physical touch panel assembly is a multi-layered module to detect a conductive object. In one embodiment, the multi-layer stack-up of a touch panel assembly includes a PCB, an adhesive layer, and an overlay. The PCB may include the processing device 210 and other components, such as the connector to the host 250, necessary for operations for sensing the capacitance. These components may be disposed on the non-sensing side of the PCB. The PCB may also include a touch panel disposed on the opposite side; the sensing side of the PCB. Alternatively, other multi-layer stack-ups may be used in the assembly.

The PCB may be made of standard materials, such as FR4 or Kapton™ (e.g., flexible PCB). Alternatively, the PCB may be made of non-flexible PCB material. In either case, the processing device 210 may be attached (e.g., soldered) directly to the sensing PCB (e.g., attached to the non-sensing side of the PCB). The PCB thickness varies depending on multiple variables, including height restrictions and sensitivity requirements. In one embodiment, the PCB thickness is at least approximately 0.3 millimeters (mm). Alternatively, the PCB may have other thicknesses. It should be noted that thicker PCBs may yield improved sensitivity. The PCB length and width is dependent on individual design requirements for the device on which the sensing device is mounted, such as a notebook or mobile handset.

The adhesive layer may be directly on top of the PCB sensing array and is used to affix the overlay to the overall touchpad assembly. Typical material used for connecting the overlay to the PCB is non-conductive adhesive such as 3M 467 or 468. In one exemplary embodiment, the adhesive thickness is approximately 0.05 mm. Alternatively, the adhesive may be present on the bottom or back side of the overlay, and other thicknesses may be used.

The overlay may be non-conductive material used to protect the PCB circuitry from environmental conditions and electric static discharge (ESD), and to insulate the user's finger (e.g., conductive object) from the circuitry. Overlay can be ABS plastic, polycarbonate, glass, or polyester film, such as Mylar™ polyester film. Alternatively, other materials known by those of ordinary skill in the art may be used. In one exemplary embodiment, the overlay has a thickness of approximately 1.0 mm. In another exemplary embodiment, the overlay thickness has a thickness of approximately 2.0 mm. Alternatively, other thicknesses may be used.

Although the embodiments of the touch panel 410 are described as having multiple touch-sensor buttons, alternatively, the embodiments may be implemented with one or more individual sensor elements that are not located in a touch panel.

Figure 5A:
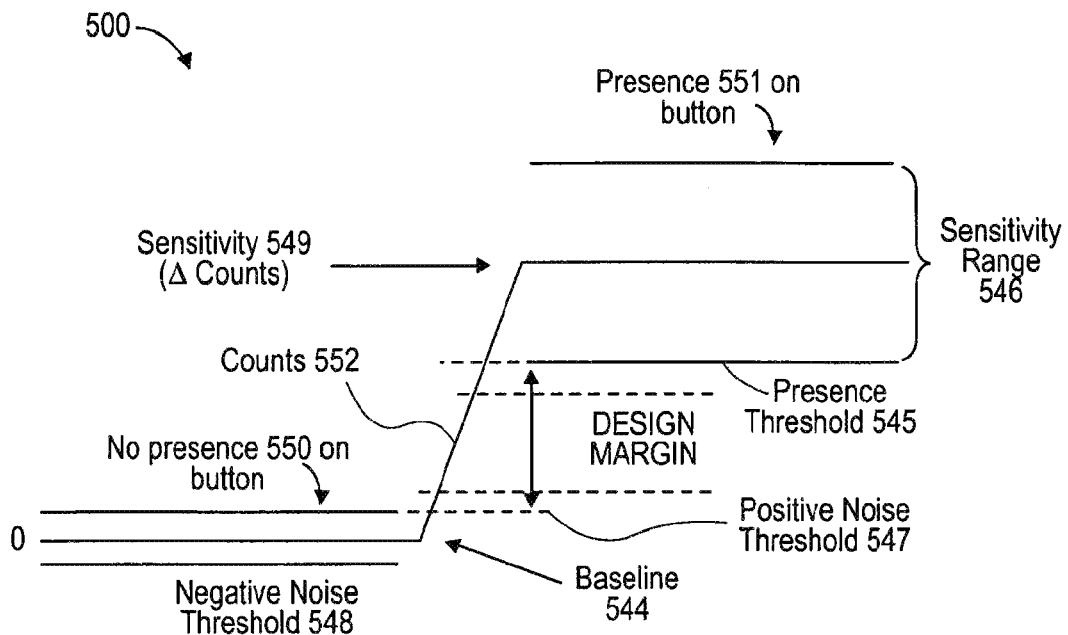
FIG. 5A illustrates a graph of a sensitivity of a single touch-sensor button.

FIG. 5A illustrates a graph of a sensitivity of a single touch-sensor button. Graph 500 includes the counts 552 as measured on a single touch-sensor button for "no presence" 550 on the touch-sensor button, and for "presence" 551 on the touch-sensor button. "No presence" 550 is when the sensing device does not detect the presence of the conductive object, such as a finger. "No presence" 550 is detected between a range of noise. The range of noise may include a positive noise threshold 547 and a negative noise threshold 548. So long as the counts 552 are measured as being between the positive and negative thresholds 547 and 548, the sensing device detects "no presence" 550. "Presence" 551 is when the sensing device detects the presence of the conductive object (e.g., finger). "Presence" 551 is detected when the counts 552 are greater than a presence threshold 545. The presence threshold 545 indicates that a presence of a conductive object is detected on the sensing device. The sensitivity 549 (Cf/Cp) of the single button operation may be such that when it detects the presence of the conductive object, the capacitance variation (Δn) is above the presence threshold 545. Alternatively, the button operation may be activated when a tap gesture is recognized on the touch-sensor button. The sensitivity 549 may have a range, sensitivity range 546. Sensitivity range 546 may have a lower and upper limit or threshold. The lower threshold is equal to or greater than the presence threshold 545, allowing a "presence" 551 to be detected on the touch-sensor button. The sensing device may be configured such that there is a design margin between the presence threshold 545 and the positive noise threshold 547. The sensitivity range 546 is based on the surface area of the touch-sensor button.

Figure 5B:
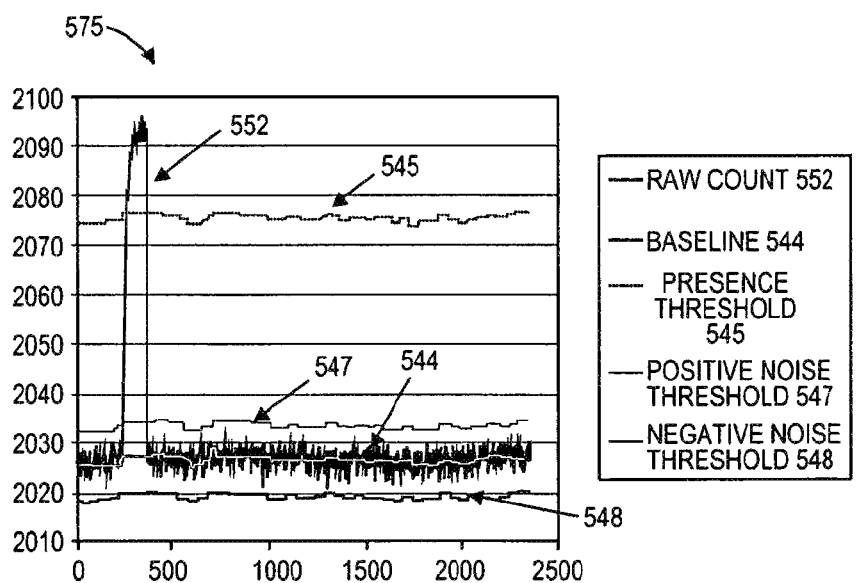
FIG. 5B illustrates a graph of capacitance measured on a single touch-sensor button.

FIG. 5B illustrates a graph of capacitance measured on a single touch-sensor button. Graph 575 illustrates the measured capacitance as raw counts 552 as well as the baseline 544 the presence threshold 545, positive noise threshold 547, and the negative noise threshold 548. As illustrated in graph 575, the raw counts 552 increase above the presence threshold 545, which is at approximately 2075 counts, the presence of the finger is detected on the sensing device. Although the presence threshold 545 is illustrated as being at 2075, and the baseline at 2025, other values may be used.

Figure 6A:
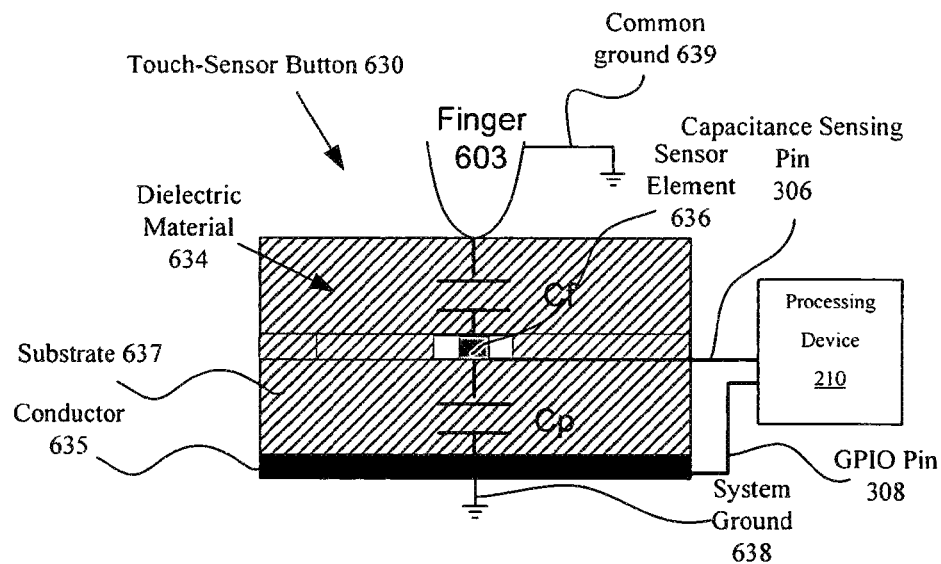
FIG. 6A illustrates a cross-sectional view of a touch-sensor button having a grounded conductor disposed on a separate layer than the sensor element to detect the presence of a finger on the touch-sensor button.

FIG. 6A illustrates a cross-sectional view of a touch-sensor button 630 having a grounded conductor 635 disposed on a separate layer than the sensor element 636 to detect the presence of a finger 603 on the touch-sensor button 630. The conductor 635 is connected to system ground 638 and the sensor element 636 is connected to a sensing line of the processing device 210 via capacitance sensing pin 306. When a conductive object, such as finger 603, is placed in proximity to the sensor element 636, there is a capacitance, Cf, between the sensor element 636 and the conductive object with respect to a common ground 639. There is also parasitic capacitance Cp between the conductors 635 and 636. The capacitance between the electrodes when no conductive object is present is the base capacitance Cp that may be stored as a baseline value. There is also a total capacitance (Cp+Cf) on the sensor element 636 when the conductive object (e.g. finger 603) is present on or in close proximity to the touch-sensor button 630. The baseline capacitance value Cp may be subtracted from the total capacitance when the conductive object is present to determine the change in capacitance (e.g., capacitance variation Cf) when the conductive object is present and when the conductive object is not present on the touch-sensor button 630. Effectively, the capacitance variation Cf can be measured to determine whether finger 603 is present or not (e.g., sensor activation) on the touch-sensor button 630. The capacitance on the sensor element 636 may be measured using capacitance sensing techniques, such as using a relaxation oscillator circuit (illustrated in FIG. 3A), a sigma-delta modulator circuit (illustrated in FIG. 3B), a charge transfer circuit, a charge-accumulation circuit, or the like.

Figure 6B:
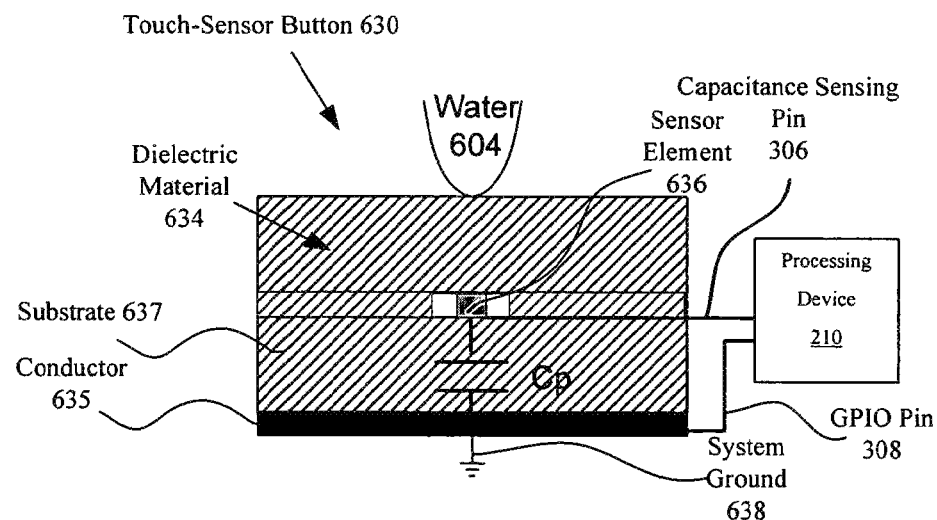
FIG. 6B illustrates a cross-sectional view of a touch-sensor button having a grounded conductor disposed on a separate layer than the sensor element to prevent the unintentional activation of the touch-sensor button caused by a presence of water.

In this embodiment, instead of the sensor element 636 being surrounded by a fixed ground as done in the conventional design of a touch-sensor button, a ground conductor 635 is placed on a separate layer or a separate plane than the sensor element 636 of touch-sensor button 630. By not surrounding the sensor element 636 with grounded conductors in the same plane, the possibility that the water 604 (e.g., water drop or film of water) on the overlay of dielectric material 634 of the touch-sensor button 630 acts as a bridging conductor is decreased and possibly eliminated, as illustrated in FIG. 6B. It should be noted that the water 604 may behave as a floating conductor that is not grounded. In this embodiment, the presence of water 604 does not introduce a capacitance Cf on the sensor element 636 to unintentionally activate the touch-sensor button 630. The touch-sensor button 630 is configured to detect only grounded conductors, such as finger 603, or other grounded conductive objects, and to prevent floating conductors, such as water 604, from unintentionally activating the touch-sensor button 630. Accordingly, disposing a ground conductor on a separate plane than the sensor element may prevent the unintentional activation of the touch-sensor button caused by water 604.

In one embodiment, the ground conductor 635 is a ground plane disposed on a separate layer than the sensor element 636. Alternatively, the ground conductor may be a conductor that has similar or dissimilar dimensions as the sensor element 636.

In one embodiment, the sensor element is disposed on a first layer (e.g., top layer). An overlay of non-conductive material may be disposed on the first layer. The overlay may be used to protect the sensor element 636 from environmental conditions and ESD, and to insulate the user's finger 603 (e.g., conductive object) from the circuitry of the touch-sensor button 630. On a separate layer than the first layer, a grounded conductor 635 is disposed. In one embodiment, the separate layer and first layer are disposed on opposite sides of a substrate 637 of non-conductive material. Alternatively, the layers may be different sides of two or more substrates.

In this embodiment, the first layer is disposed between the substrate 637 and the overlay (e.g., dielectric material 634) upon which the conductive object 603 or water 604 is detected. The grounded conductor 635 of the separate layer is disposed on the other side of the substrate 637 and has a distance between the surface of the overlay where conductive object 603 or water 604 is detected and the nearest surface of the separate layer. The distance between the surface of the overlay and the grounded conductor 636 is configured to reduce the possibility of the water 604 acting as a bridge conductor, which generates a sufficient amount of capacitance Cf to unintentionally activate the touch-sensor button.

In another embodiment, the separate layer and first layer are disposed on separate layers of the same side of a substrate, with insulating material in between the sensor element and the grounded conductors. Alternatively, the sensor elements and the grounded conductor may be disposed in the different planes of the same layer, using conductive ink and insulating material.

This embodiment uses placement of the ground with respect to the overlay surface to prevent the unintentional activation of the touch-sensor button, however, other configurations may be used to prevent the unintentional activation of the touch-sensor button, such as a guard sensor as described below. The embodiments described above may also be implemented in conjunction with the embodiments of the guard sensor described below.

Figure 7A:
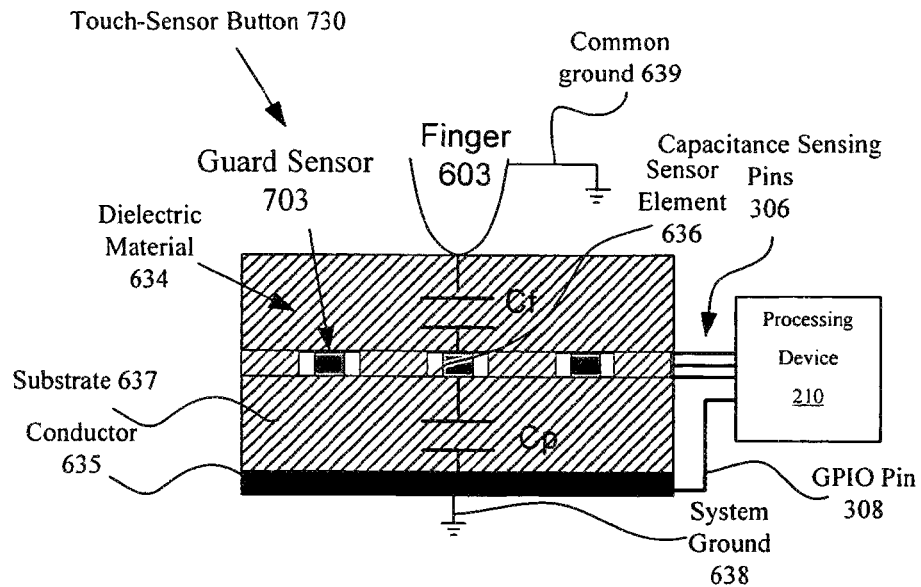
FIG. 7A illustrates a cross-sectional view of a touch-sensor button having a grounded conductor and a guard sensor to detect the presence of a conductive object on the touch-sensor button.
Figure 7B:
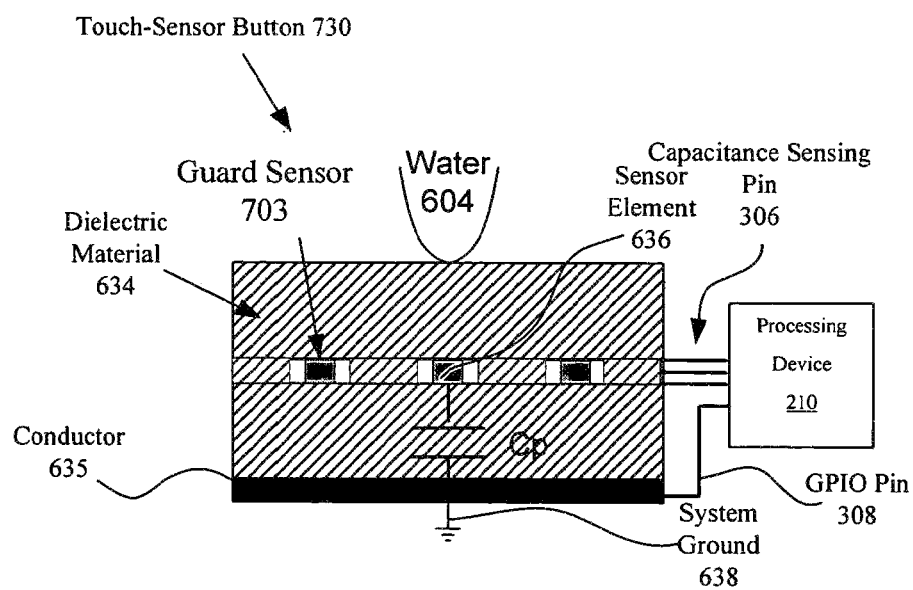
FIG. 7B illustrates a cross-sectional view of a touch-sensor button having a grounded conductor and a guard sensor to prevent the unintentional activation of the touch-sensor button caused by a presence of water.

FIGS. 7A and 7B illustrate cross-sectional views of a touch-sensor button 730 having a grounded conductor 635 and a guard sensor 703 to detect the presence of a finger 603 on the touch-sensor button 730 and to prevent the unintentional activation of the touch-sensor button 730 caused by a presence of water 604. The capacitance touch-sensor button 730 is similar to the capacitance touch-sensor button 630, except the capacitance touch-sensor button 730 includes a guard sensor 703. In this embodiment, the guard sensor 703 is disposed in the same plane and layer as the sensor element 636. Alternatively, the guard sensor 703 may be disposed in a separate plane or in a separate layer than the layer in which the sensor element 636 is disposed. Also, as described in more detail below, the guard sensor 703 may be a sensor element of similar dimensions to the sensor element 636, or alternatively, the guard sensor 703 may have dissimilar dimensions, and may be disposed to be adjacent to, partially surround, substantially surround, or completely surround the sensor element 636. The guard sensor 703 is also coupled to a sensing line of the processing device 210 via the capacitance sensing pin 306. It should be noted that the conductor of the guard sensor is electrically isolated from the sensor element 636, as well as their connecting traces (e.g., sensing lines and pins) that are connected to the processing device 210. The processing device 210 is configured to sense the capacitance on both the sensor element 636 and the guard sensor 703 to prevent the unintentional activation of the touch-sensor button caused by the presence of water 604 on the overlay of the touch-sensor button 630, as described in more detail below. Accordingly, like disposing a ground conductor on a separate plane than the sensor element, using an additional sensor element (e.g., guard sensor 703), the processing device 210, may be configured to prevent the unintentional activation of the touch-sensor button 630 caused by the presence of water 604.

In another embodiment, the sensor element 636 is surrounded by ground, as done conventional, and the guard sensor 703 is used in conjunction with the processing device 210 to detect the presence of water 604 and to prevent the unintentional activation of the touch-sensor button 730 caused by the presence of water 604.

Figure 7C:
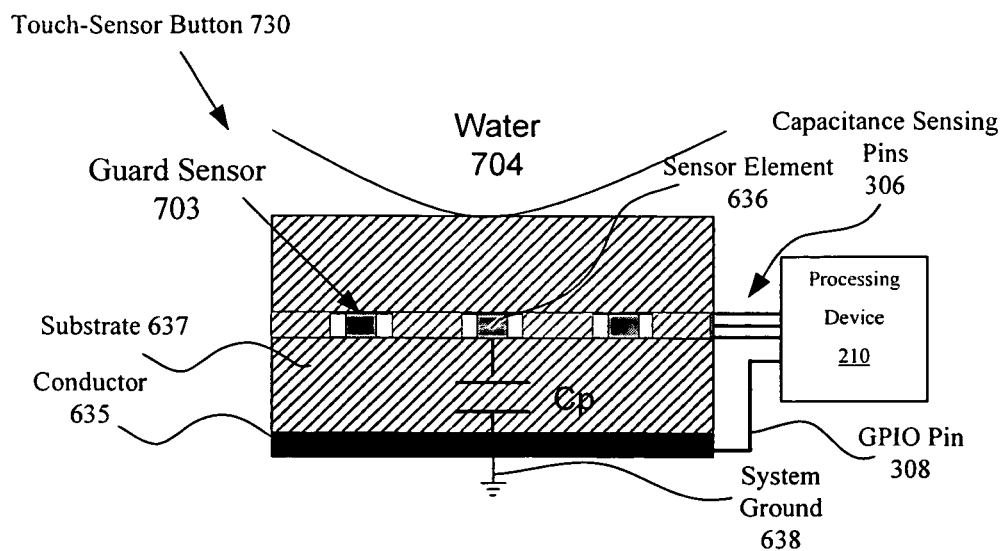
FIG. 7C illustrates a cross-sectional view of a touch-sensor button having a grounded conductor and a guard sensor to prevent the unintentional activation of the touch-sensor button caused by a presence of water that is larger than a sensor element of the touch-sensor button.

Although the water 604 is illustrated as being a similar magnitude in width to the width of sensor element 636 of the touch-sensor button, the water 604 may be smaller or larger (as illustrated in FIG. 7C) in width than the sensor element 636.

FIG. 7C illustrates a cross-sectional view of a touch-sensor button 730 having a grounded conductor 635 and a guard sensor 703 to prevent the unintentional activation of the touch-sensor button 730 caused by a presence of water 704 that is larger than a sensor element of the touch-sensor button. In this embodiment, the water 704 is larger than the water 604. The water 704 may be a film of water that is present on the touch-sensor button 730 from, for example, a user wiping the surface of the touch panel with a wet dish cloth. Wiping the surface of the touch-sensor button 730 may leave a film of water, instead of a drop of water. The use of the guard sensor 703 and/or the grounded conductor 635 may prevent the unintentional activation of the touch-sensor button 730 caused by the presence of the water 704 on the touch-sensor button 730.

Although the embodiments described above describe detecting the presence of a finger 703, alternatively, the embodiments may be used to detect the presence of other conductive objects as known by those of ordinary skill in the art.

Figure 8A:
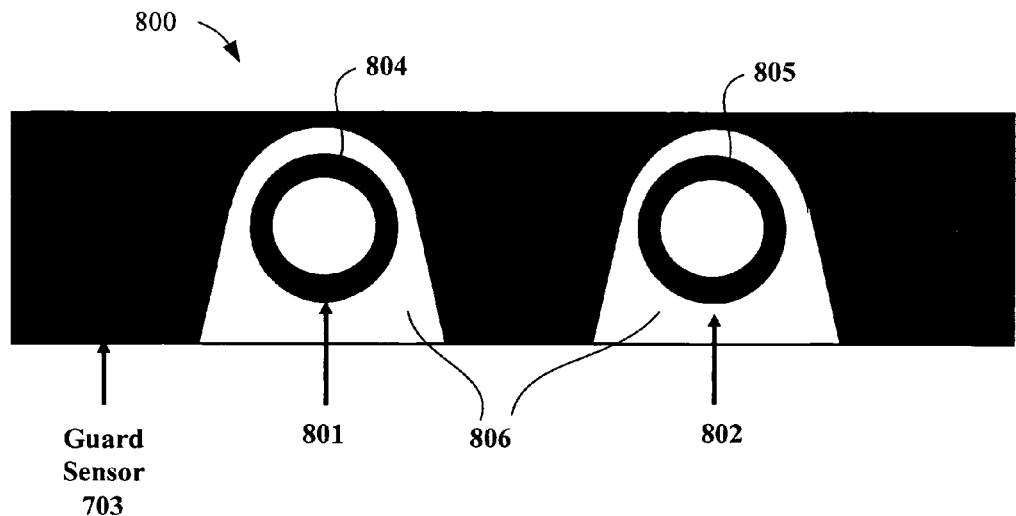
FIG. 8A illustrates a bottom-side view of one embodiment of a guard sensor disposed to substantially surround two touch-sensor buttons of a touch panel.

FIG. 8A illustrates of one embodiment of a guard sensor 703 disposed to substantially surround two touch-sensor buttons 801 and 802 of a touch panel 800. The touch-sensor buttons 801 and 802 each include a sensor element 804 and 805, respectively, which are used by the processing device 210 to detect the presence of the conductive object on the touch-sensor buttons 801 and 802. The guard sensor 703 is also a sensor element that is coupled to the processing device 210. The processing device 210 is configured to measure a capacitance on either the guard sensor 703 or on the guard sensor 703 and the other sensor elements 804 and 805 to determine the presence of the conductive object, and to prevent the unintentional activation of one of the touch-sensor buttons 801 and 802 caused by the presence of water. In one embodiment, if the capacitance on the guard sensor 703 is over a rejection threshold, the activations of the touch-sensor buttons 801 and 802 are ignored, preventing the unintentional activations of the touch-sensor buttons 801 and 802. The rejection threshold may be the same as the presence threshold. Alternatively, the rejection threshold may be set lower or higher than the presence threshold. In another embodiment, if the guard sensor 703 is activated in addition to either of the sensor elements 804 or 805, the unintentional activation of either the sensor element 804 or 805 is ignored.

In this embodiment, the guard sensor 703 is disposed to substantially surround the sensor elements 804 and 805 that correspond to the touch-sensor buttons 801 and 802, respectively. The touch panel 800 also includes an insulation area 806 of non-conductive material. The insulation area 806 is disposed between the guard sensor 703 and the other sensor elements 804 and 805. In particular, the insulation area 806 is disposed so that the guard sensor 703 is disposed to substantially surround the sensor elements 804 and 805, instead of completely surrounding the sensor elements. In one embodiment, the insulation area 806 provides an area where a finger or conductive object can intentionally activate the touch-sensor buttons 801 and 802, without activating the guard sensor 703. In one embodiment, the area is the width of the sensor element 804 and 805 of each of the touch-sensor buttons 801 and 802. Alternatively, other widths and dimensions for this area may be used. In one embodiment, the insulation area 806 is optimized to allow for presses that are not strictly 90 degree oblique to the touch panel. This configuration may ensure normal usage for finger presses, without being rejected by the guard sensor 703. Alternatively, the guard sensor 703 may be disposed in other locations with respect to the other sensor elements 804 and 805 of the touch-sensor buttons 801 and 802.

Figure 8B:
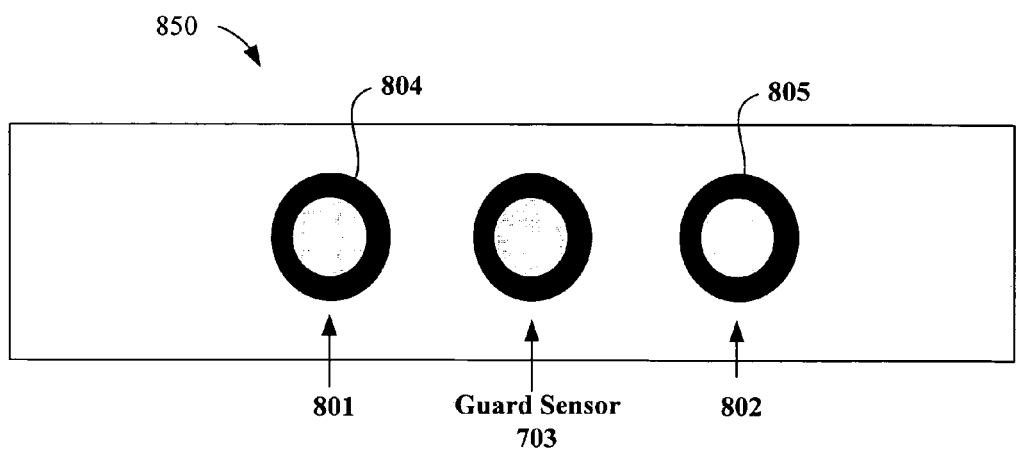
FIG. 8B illustrates a bottom-side view of one embodiment of a guard sensor disposed between two touch-sensor buttons of a touch panel.

Although the guard sensor 703 is illustrated and described as being disposed to substantially surround the sensor elements 804 and 805, alternatively, the guard sensor may be disposed to partially or completely surround the sensor elements 804 and 805, or disposed between the sensor elements, as illustrated in FIG. 8B.

FIG. 8B illustrates one embodiment of a guard sensor 703 disposed between two touch-sensor buttons 801 and 802 of a touch panel 850. The touch panel 850 is similar to the touch panel 800 of FIG. 8A, except the guard sensor 703 is an additional sensor element disposed between the two touch-sensor buttons 801 and 802, instead of disposed to substantially surround the two touch-sensor buttons 801 and 802. In this embodiment, the guard sensor 703 is of similar dimension and shape as the sensor elements 804 and 805. Alternatively, the guard sensor 703 may have dissimilar dimensions and/or dissimilar shapes as the sensor elements 804 and 805.

In this embodiment, the three sensor elements (703, 804, and 805) are coupled to the processing device 210 (e.g., via capacitance sensing pins 306). The processing device 210 is configured to either measure a capacitance on each of the sensor elements or a collective capacitance on all the sensor elements (e.g., by coupling the three sensor elements together when measuring). The processing device 210 determines if the capacitance is greater than a rejection threshold. If the capacitance is greater than the rejection threshold, the processing device 210 may prevent any unintentional activation of the touch-sensor buttons 801 and 802. Alternatively, the processing device 210 may determine if the guard sensor 703 is activated or not in determining whether the activation of either sensor element 804 or 805 has been unintentionally activated due to the presence of water 604 or 704. If the guard sensor 703 has been activated, the sensor activations of sensor elements 804 or 805 are ignored, and if the guard sensor 703 has not been activated, the sensor activations of the sensor elements 804 or 805 are accepted as intentional.

The sensor elements 804 and 805 of FIGS. 8A and 8B have been illustrated as rings, having an outer ring of conductive material with an inside of non-conductive material or air. Alternatively, the sensor elements 804 and 805 of FIGS. 8A and 8B may be other shapes, such as circular, square, rectangular, semi-circular, oval, diamond, hexagonal, pentagonal, octagonal, or the like.

In one embodiment, the touch panel (e.g., 800 or 850) is used as a control panel of a household appliance. The household appliance may be an oven, a stove, a microwave, a blender, a heater, a washer, a dryer, a toaster, a dishwasher, or the like. Alternatively, the touch panel may be used in a control panel of other consumer products, industrial products, or the like that are exposed to humidity or water.

It should be noted that although the embodiments above are described with respect to water 604 and 704, the embodiments are not limited to preventing unintentional activations of one or more touch-sensor buttons caused by the presence of water, but may prevent the unintentional activations caused by the presence of other conductive liquids. The conductive liquids may behave like a floating conductor that is not grounded.

Figure 9:
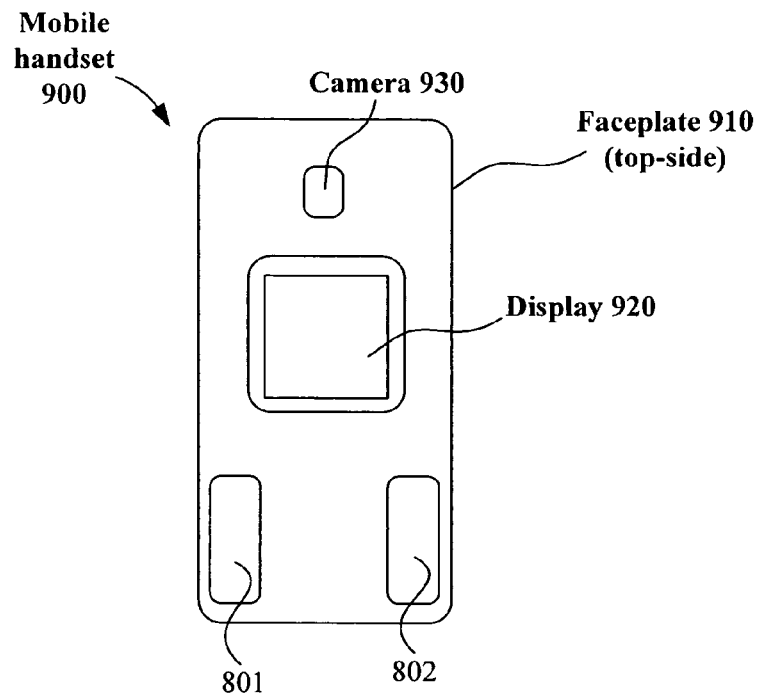
FIG. 9 illustrates a top-side view and a bottom-side view of one embodiment of a case of a mobile handset having two touch-sensor buttons and a guard sensor to prevent an unintentional activation of the touch-sensor buttons caused by the presence of conductive liquid.
Figure 9:
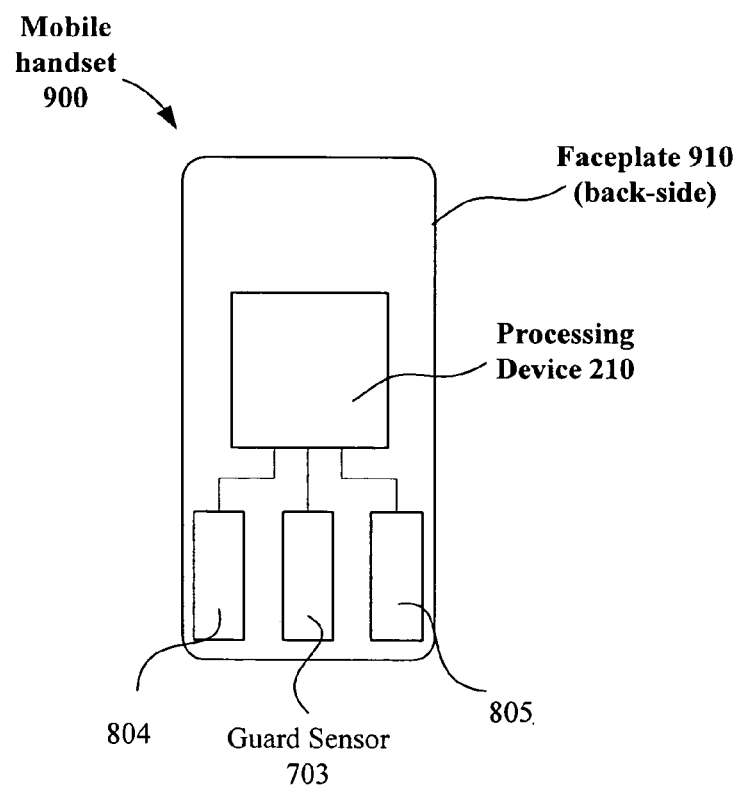

FIG. 9 illustrates a top-side view and a bottom-side view of one embodiment of a case 910 of a mobile handset 900 having two touch-sensor buttons 801 and 802 and a guard sensor 703 to prevent an unintentional activation of the touch-sensor buttons 801 and 802 caused by the presence of conductive liquid, such as water. The top-side view illustrates the case 910 (e.g., faceplate or outside housing of the mobile handset 900), which includes openings for a display 920, camera 930, and touch-sensor buttons 801 and 802. The display 920 may be configured to display text, images, and/or video. The camera 930 may be configured to capture images and/or video. The touch-sensor buttons 801 and 802 are configured to be input buttons for the mobile handset 900. The camera 930 and display 920 are known by those of ordinary skill in the art, and accordingly, a detailed description regarding their operation has not been included. The touch-sensor buttons 801 and 802 operate similarly to the touch-sensor buttons described herein. The back-side view illustrates the case 910 to which the processing device 210, sensor elements 804 and 805, and guard sensor 703 are coupled. It should be noted that the mobile handset 900 may include additional components that are known by those of ordinary skill in the art, and may include less components than illustrated in FIG. 9, such as the display 920 or camera 930.

Sensor elements 804 and 805 and guard sensor 703 are coupled to the processing device 210 (e.g., via capacitance sensing pins 306 of processing device 210), using for example, wires or conductive traces. In one embodiment, the processing device 210, sensor elements 804 and 805, and guard sensor 703 are disposed on a common substrate, for example, a substrate of a printed circuit board. Alternatively, the processing device 210, sensor elements 804 and 805, and guard sensor 703 is disposed in other configurations, such as the processing device 210 disposed on one substrate and the sensor elements (804, 804, and 703) are disposed on a separate substrate or directly on the case 910.

Although guard sensor 703 is illustrated as a sensor element having similar shape and dimensions to the sensor elements 804 and 805, the guard sensor 703 may have other dimensions and/or shapes than the sensor elements 804 and 805. Similarly, although guard sensor 703 is illustrated as a sensor element disposed between the sensor elements 804 and 805, the guard sensor 703 may be disposed in other configurations, such as disposed to partially surround, substantially surround, or completely surround the sensor elements 804 and 805.

Using this embodiment, as conductive liquid is present on the case of the mobile handset 900, the processing device 210 may prevent the unintentional activations of the touch-sensor buttons 801 and 802. Using the guard sensor 703, the processing device 210 may determine that the guard sensor 703 has been activated in addition to the touch-sensor buttons 801 and 802, and consequently, ignore the unintentional activations of the touch-sensor buttons 801 and 802 by the presence of conductive liquid, such as a film of conductive liquid on the surface of the case 910. In this embodiment, the guard sensor 703 is located between the sensor elements 804 and 805 of the touch-sensor buttons 801 and 802 to reject any conductive liquid that covers the entire sensor area. In another embodiment, the use of the guard sensor 703 is combined with a ground conductor that is disposed on a separate plan than the sensor elements to prevent the unintentional activation of the sensor buttons when the conductive liquid is not large enough to activate the guard sensor 703. Alternatively, the guard sensor 703 may be other sizes and be disposed in other locations to prevent the unintentional activation of one or more touch-sensor buttons by the presence of conductive liquid, while allowing the intentional activations of the touch-sensor buttons.

Figure 10:
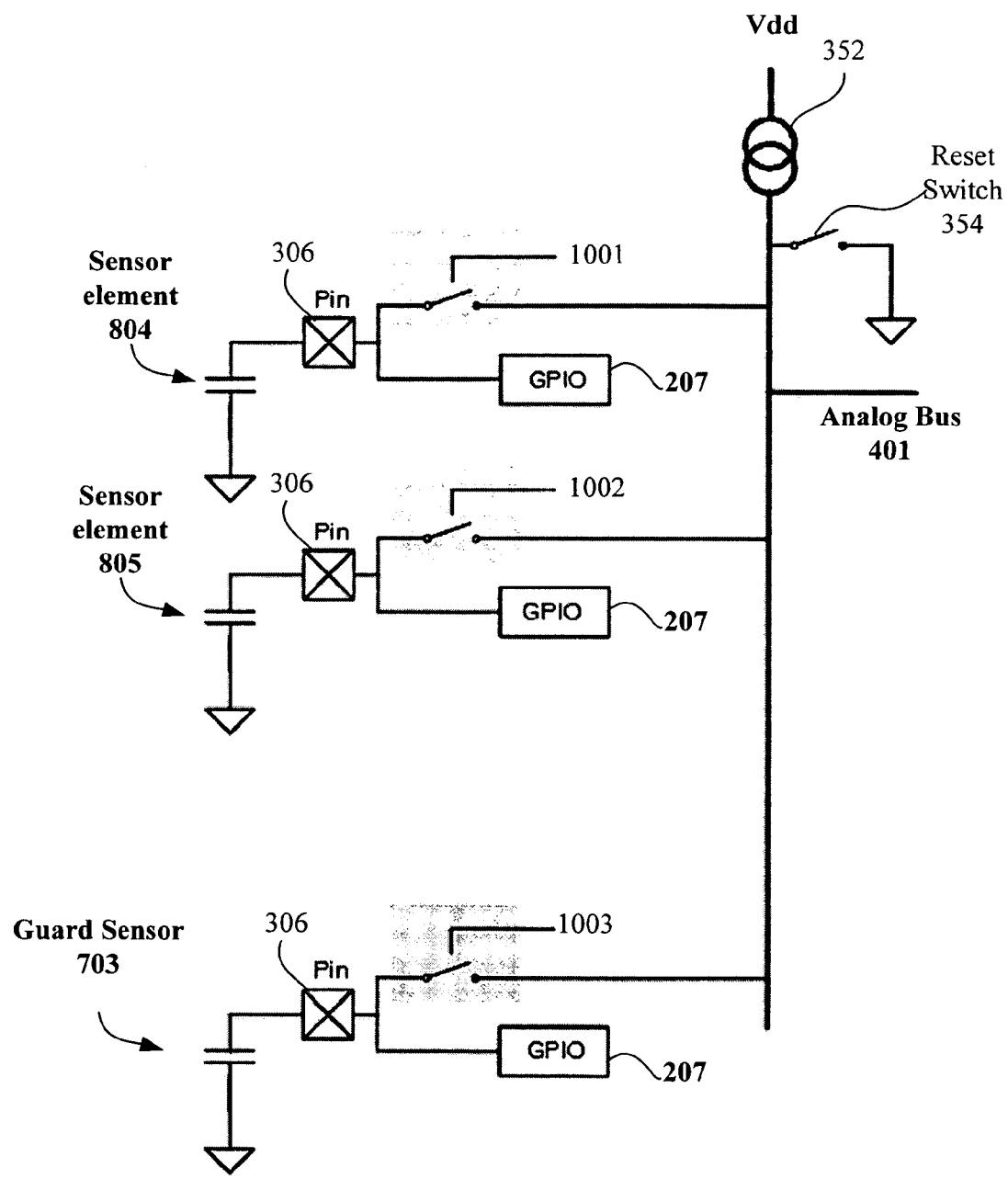
FIG. 10 illustrates one embodiment of a selection circuit coupled to an analog bus for measuring capacitance on the sensor elements and the guard sensor.

FIG. 10 illustrates one embodiment of a selection circuit coupled to an analog bus 401 for measuring capacitance on the sensor elements 804 and 805 and the guard sensor 703. As previously described, the selection circuit is coupled to the sensor elements (e.g., 804, 805, and guard sensor 703) via capacitance sensing pins 306, current source 352, reset switch 354, and a comparator 353 (not illustrated) via analog bus 401. The selection circuit may be configured to sequentially select a sensor element of the multiple sensor elements 804, 805, and 703 to provide the charge current and to measure the capacitance of each sensor element 804, 805, and 703. In one exemplary embodiment, the selection circuit is a multiplexer array of the relaxation oscillator 350. Alternatively, selection circuit may be other circuitry outside the relaxation oscillator 350, or even outside the capacitance sensor 201 to select the sensor element to be measured. The selection circuit may also be used to ground the sensor elements that are not being measured. This may be done in conjunction with a dedicated pin in the GP10 port 207. The selection circuit may also be used to couple all the sensor elements 804, 805, and/or 703 at the same time. When the sensor elements 804, 805, and 703 are coupled together the processing device 210 may be configured to measure the capacitance on all three sensor elements. Alternatively, the processing device 210 may sequentially or simultaneously scan each of the sensor elements individually. The processing device 210 can select the sensor elements 804, 805, and 703 using selection control lines 1001, 1002, and 1003, respectively.

Figure 11:
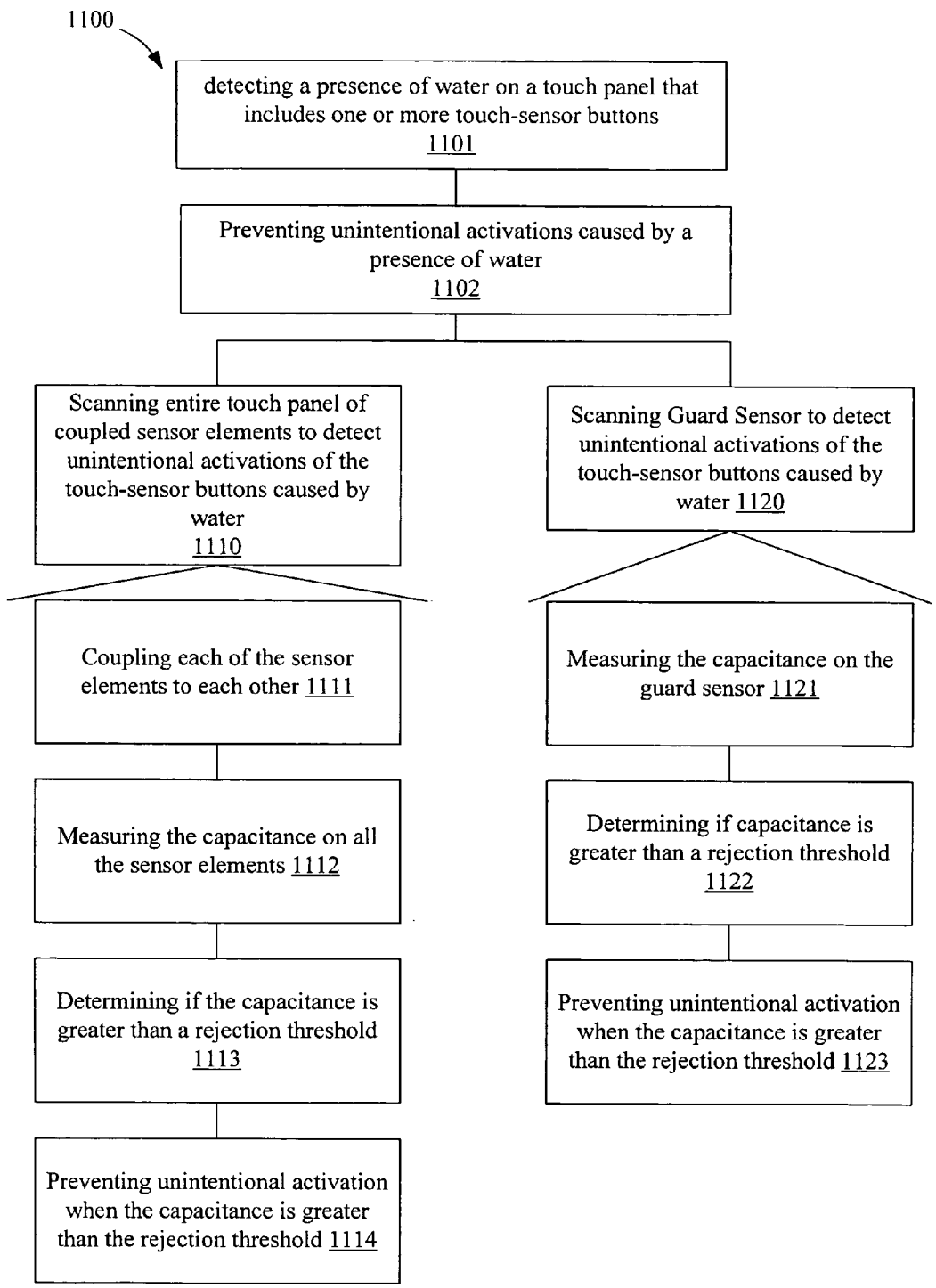
FIG. 11 illustrates two embodiments of a method of preventing unintentional activations of the touch-sensor buttons caused by the presence of conductive liquid.

FIG. 11 illustrates two embodiments of a method 1100 of preventing unintentional activations of the touch-sensor buttons caused by the presence of conductive liquid. The method 1100 includes detecting a presence of conductive liquid by a touch panel that includes one or more touch-sensor buttons, operation 1101. The one or more touch-sensor buttons each include a corresponding sensor element. Method 1100 further includes preventing unintentional activation of the one or more touch-sensor buttons caused by the conductive object using all the sensor elements of the touch panel or using an additional capacitance sensor element, operation 1102. The additional sensor element is the guard sensor 703, as described herein.

In one embodiment, preventing the unintentional activations of operation 1102 may be performed by using the one or more sensor elements. This embodiment includes scanning the entire touch panel of coupled sensor elements to detect unintentional activations of the touch-sensor buttons caused by conductive liquid, operation 1110. In this embodiment, a grounded conductor may be disposed on a bottom layer of a non-conductive substrate and the sensor elements of the touch-sensor buttons are disposed on the top layer of the non-conductive substrate. In another embodiment, preventing the unintentional activations of operation 1102 may be performed by using the guard sensor 703, operation 1120.

Scanning the entire touch panel of coupled sensor elements of operation 1110 may further include coupling all (or some of) the sensor elements to each other, operation 1111, and measuring the capacitance on all the coupled sensor elements, operation 1112. This embodiment further includes determining if the capacitance on all the sensor elements is greater than a rejection threshold, operation 1113, and preventing unintentional activation when the capacitance is greater than the rejection threshold, operation 1114. Alternatively, the sensor elements are sequentially scanned to determine the capacitance on each sensor element to detect a presence of a conductive object or a presence of conductive liquid.

Scanning the guard sensor 703 of operation 1120 may further include measuring the capacitance on the guard sensor 703, operation 1121. This embodiment further includes determining if the capacitance on the guard sensor 703 is greater than a rejection threshold, operation 1122, and preventing unintentional activation when the capacitance is greater than the rejection threshold, operation 1123. In one embodiment, the rejection threshold is a presence threshold at which the guard sensor is activated. If the guard sensor is activated, any sensor activations of the sensor elements 804 or 805 are ignored. The conductive liquid may be a water film that covers some or the entire surface of the overlay above the sensor elements and the guard sensor.

Figure 12:
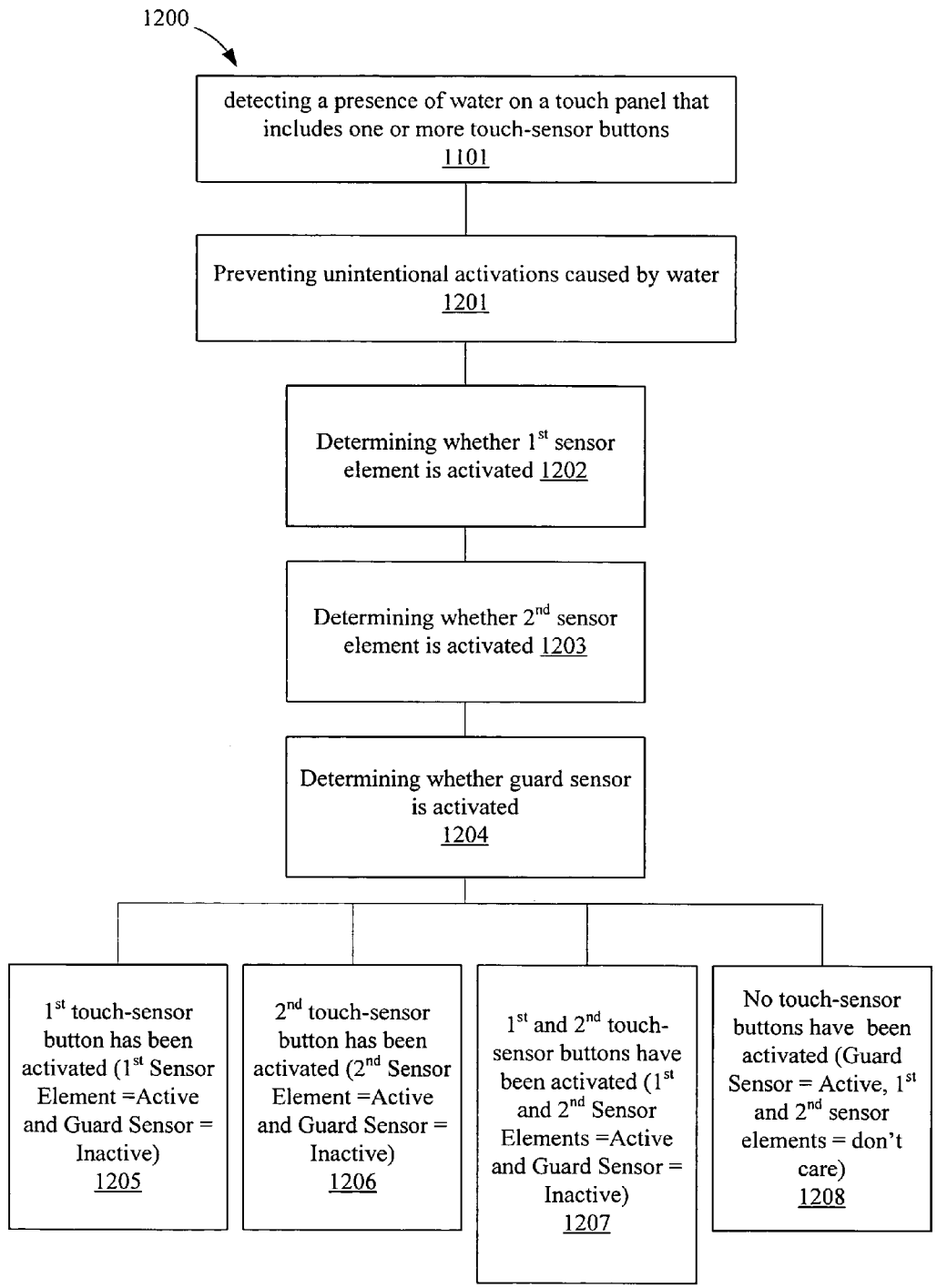
FIG. 12 illustrates one embodiment of a method of preventing unintentional activations of the first and second touch-sensor buttons caused by conductive liquid using a guard sensor.

FIG. 12 illustrates one embodiment of a method of preventing unintentional activations of the first and second touch-sensor buttons 801 and 802 caused by conductive liquid using a guard sensor 703. Method 1200 includes detecting a presence of conductive liquid on a touch panel that includes one or more touch-sensor buttons, operation 1101. Method 1200 also includes preventing unintentional activation of the touch-sensor buttons 801 and 802 caused by the presence of conductive liquid, such as water 604 or 704, using an additional capacitance sensor element, operation 1201. Similarly, the additional capacitance sensor element is the guard sensor 703. This embodiment includes determining whether the first sensor element 804, the second sensor element 805, and/or the guard sensor 703 has been activated, operations 1202-1204. The first touch-sensor button 801 has been activated when the first sensor element 804 is activated and the guard sensor 703 is not activated, operation 1205. The second touch-sensor button 802 has been activated when the second sensor element 805 is activated and the guard sensor 703 is not activated. The first and second touch-sensor buttons 801 and 802 have been activated when the first and second sensor elements 804 and 805 are activated and the guard sensor 703 is not activated. The touch-sensor buttons 801 and 802 are not activated when the guard sensor 703 is activated, regardless of whether the sensor element 804 has been activated and regardless of whether the sensor element 805 has been activated. The method may further include determining that neither of the touch-sensor buttons 801 and 802 have been activated when the first and second sensor elements 804 and 805 are not activated, regardless of whether the guard sensor 703 is activated or not.

In one embodiment, the gain or sensitivity of the guard sensor 703 is optimized in the processing device 210 to ensure that activations caused by the presence of conductive liquid are rejected while intended button presses are accepted. For example, a longer scan time and lower threshold can be set in the processing device 210 to increase the resolution of the guard sensor 703. Alternatively, the processing device 210 may be configured to decrease the resolution of the guard sensor 703 and increase the resolution of the other sensor elements. In one embodiment, the firmware of the processing device 210 is used in conjunction with the configuration (e.g., size and placement) of the guard sensor 703 to prevent the unintentional activation of the touch-sensor buttons of the touch panel caused by the presence of conductive liquid.

As previously described, the unintentional activation of touch-sensor button caused by conductive liquid may present a serious safety issue. Many household appliances, as well as other devices, are commonly exposed to such elements as water or humidity, which may unintentionally activate the touch-sensor button of the appliance. Unintentionally activating the touch-sensor button on some household appliance, especially ovens, stoves, microwaves, blenders, or heaters, may present serious dangers to the appliance itself, the consumer, and/or the consumer's property. Using the embodiments described herein, the unintentional activation of the touch-sensor button caused by water may be prevented. Similarly, many industrial appliances may also be exposed to such elements as water, humidity, or other conductive liquids, which may unintentionally activate one or more touch-sensor buttons of the appliance. This may also present serious dangers.

Embodiments of the present invention, described herein, include various operations. These operations may be performed by hardware components, software, firmware, or a combination thereof. As used herein, the term "coupled to" may mean coupled directly or indirectly through one or more intervening components. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Certain embodiments may be implemented as a computer program product that may include instructions stored on a machine-readable medium. These instructions may be used to program a general-purpose or special-purpose processor to perform the described operations. A machine-readable medium includes any mechanism for storing or transmitting information in a form (e.g., software, processing application) readable by a machine (e.g., a computer). The machine-readable medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory; electrical, optical, acoustical, or other form of propagated signal (e.g., carrier waves, infrared signals, digital signals, etc.); or another type of medium suitable for storing electronic instructions.

Additionally, some embodiments may be practiced in distributed computing environments where the machine-readable medium is stored on and/or executed by more than one computer system. In addition, the information transferred between computer systems may either be pulled or pushed across the communication medium connecting the computer systems.

Although the operations of the method(s) herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A method, comprising:
    detecting a presence of conductive liquid on a touch panel that includes two or more touch-sensor buttons and an additional sensor element adjacent to the two or more touch-sensor buttons;
    preventing unintentional activation, caused by the presence of the conductive liquid on the touch panel, of any of the two or more touch-sensor buttons, wherein preventing the unintentional activation comprises:
        coupling each of the sensor elements of the two or more touch-sensor buttons to the additional sensor element;
        measuring a collective capacitance on the sensor elements of the two or more touch-sensor buttons and the additional sensor element; and
        determining whether the collective capacitance exceeds the rejection threshold;
    activating any of the two or more touch-sensor buttons having a capacitance exceeding a presence threshold when the collective capacitance does not exceed a rejection threshold; and
    deactivating any of the two or more touch-sensor buttons having a capacitance exceeding the presence threshold when the collective capacitance exceeds the rejection threshold.

2. The method of claim 1, wherein the presence of conductive liquid is present on an overlay of the touch panel, which is coupled to the two or more touch-sensor buttons.

3. The method of claim 1, wherein preventing the unintentional activation further comprises preventing the unintentional activation of the two or more touch-sensor buttons when a capacitance of the additional sensor element exceeds the rejection threshold.

4. The method of claim 1, wherein the two or more touch-sensor buttons each comprise a sensor element disposed in a first layer and a grounded conductor disposed in a second layer which is coupled to a system ground.

5. The method of claim 1, wherein the two or more touch-sensor buttons each comprise a sensor element disposed in first plane of a first layer and a grounded conductor disposed in a second plane of the first layer.

6. An apparatus, comprising:
    a first sensor element;
    two or more additional sensor elements, wherein the two or more additional sensor elements correspond to two or more touch-sensor buttons of a touch panel, and wherein the first sensor element is adjacent to the two or more touch-sensor buttons; and
    a processing device, wherein the processing device is configured to:
        prevent unintentional activations of the two or more touch-sensor buttons caused by a presence of conductive liquid on the touch panel using the first sensor element and the two or more additional sensor elements, wherein to prevent the unintentional activations the processing device is further configured to measure a collective capacitance on the two or more additional sensor elements and the first sensor element that is coupled thereto, and to determine whether the collective capacitance exceeds a rejection threshold;
        activate the two or more touch-sensor buttons having a capacitance exceeding a presence threshold when the collective capacitance does not exceed the rejection threshold; and
        deactivate the two or more touch-sensor buttons having a capacitance exceeding the presence threshold when the collective capacitance exceeds the rejection threshold.

7. The apparatus of claim 6, wherein the processing device is configured to detect the presence of conductive liquid on the touch panel.

8. The apparatus of claim 6, wherein at least a portion of the first sensor element is disposed between the two or more additional sensor elements.

9. The apparatus of claim 6, wherein the first sensor element is disposed to substantially surround the two or more additional sensor elements.

10. The apparatus of claim 6, wherein the touch panel is a control panel of a household appliance.

11. The apparatus of claim 10, wherein the household appliance is at least one of an oven, a stove, a microwave, a blender, a heater, a washer, a dryer, a toaster, or a dishwasher.

12. The apparatus of claim 6, wherein the two or more touch-sensor buttons are buttons of a mobile handset.

13. The apparatus of claim 7, wherein the processing device is configured to detect the presence of conductive liquid on the touch panel based on the measured capacitance of the first sensor element.

* * * * *